US011063103B2

(12) United States Patent
Seo et al.

(10) Patent No.: US 11,063,103 B2
(45) Date of Patent: Jul. 13, 2021

(54) DISPLAY DEVICE COMPRISING THIN FILM TRANSISTORS AND METHOD FOR MANUFACTURING THE SAME

(71) Applicant: LG Display Co., Ltd., Seoul (KR)

(72) Inventors: JungSeok Seo, Paju-si (KR); PilSang Yun, Paju-si (KR); SeHee Park, Paju-si (KR); Jiyong Noh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 27 days.

(21) Appl. No.: 16/666,869

(22) Filed: Oct. 29, 2019

(65) Prior Publication Data
US 2020/0144347 A1    May 7, 2020

(30) Foreign Application Priority Data

Nov. 7, 2018  (KR) ......................... 10-2018-0135718

(51) Int. Cl.
  *H01L 27/32* (2006.01)
  *H01L 27/12* (2006.01)

(52) U.S. Cl.
  CPC ........ *H01L 27/3262* (2013.01); *H01L 27/124* (2013.01); *H01L 27/127* (2013.01); *H01L 27/1262* (2013.01); *H01L 27/3276* (2013.01); *H01L 2227/323* (2013.01)

(58) Field of Classification Search
  CPC .............. H01L 27/3262; H01L 27/124; H01L 27/1262; H01L 27/127; H01L 27/3276
  See application file for complete search history.

(56) References Cited

U.S. PATENT DOCUMENTS

2013/0256666 A1* 10/2013 Chang ............... H01L 29/78693
                                                          257/57
2018/0040639 A1*  2/2018 Lee .................... H01L 27/1225

* cited by examiner

*Primary Examiner* — Mark Anthony Armand
(74) *Attorney, Agent, or Firm* — Morgan, Lewis & Bockius LLP

(57) ABSTRACT

A display device includes a substrate, a pixel driver on the substrate, and a display element connected to the pixel driver. The pixel driver includes a conductive layer on the substrate, a buffer layer on the conductive layer, a semiconductor layer on the buffer layer, a gate electrode, the gate electrode overlapping the semiconductor layer, and a source electrode and a drain electrode connected to the semiconductor layer. The buffer layer includes a flattened portion overlapping the conductive layer, and a stepped portion overlapping the periphery of the conductive layer. The semiconductor layer includes a first oxide semiconductor layer on the buffer layer, and a second oxide semiconductor layer on the first oxide semiconductor layer. A width of the first oxide semiconductor layer is larger than a width of the second oxide semiconductor layer, and the first oxide semiconductor layer is on the stepped portion of the buffer layer.

17 Claims, 25 Drawing Sheets

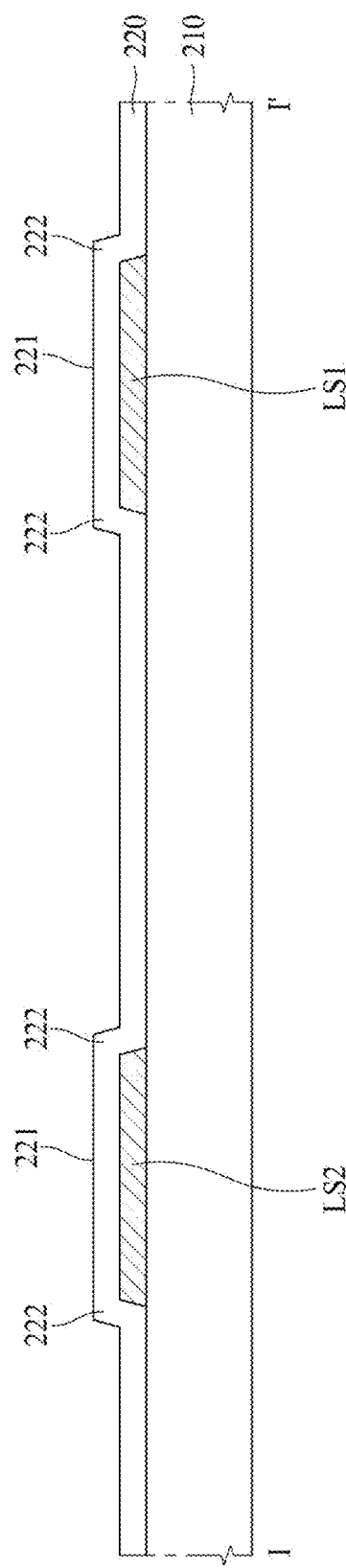
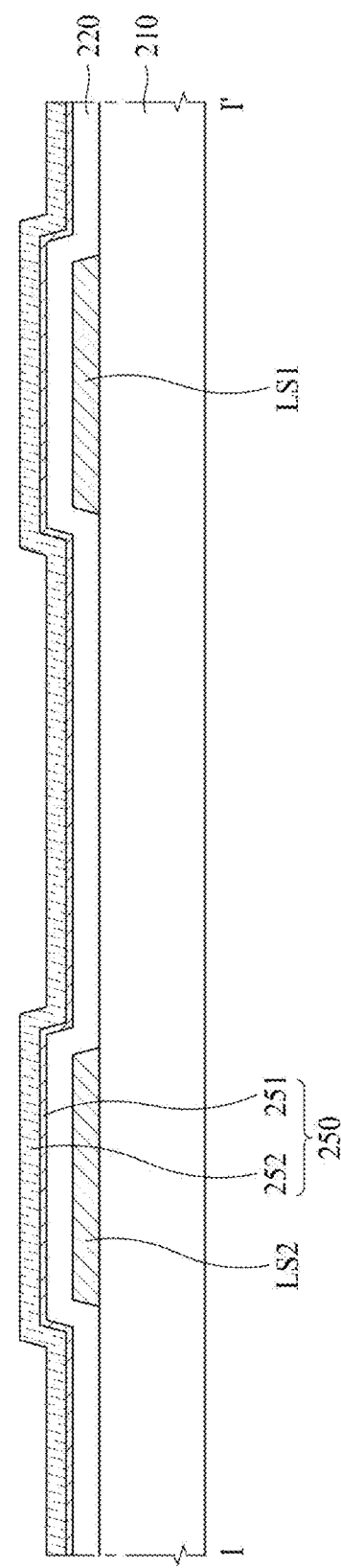

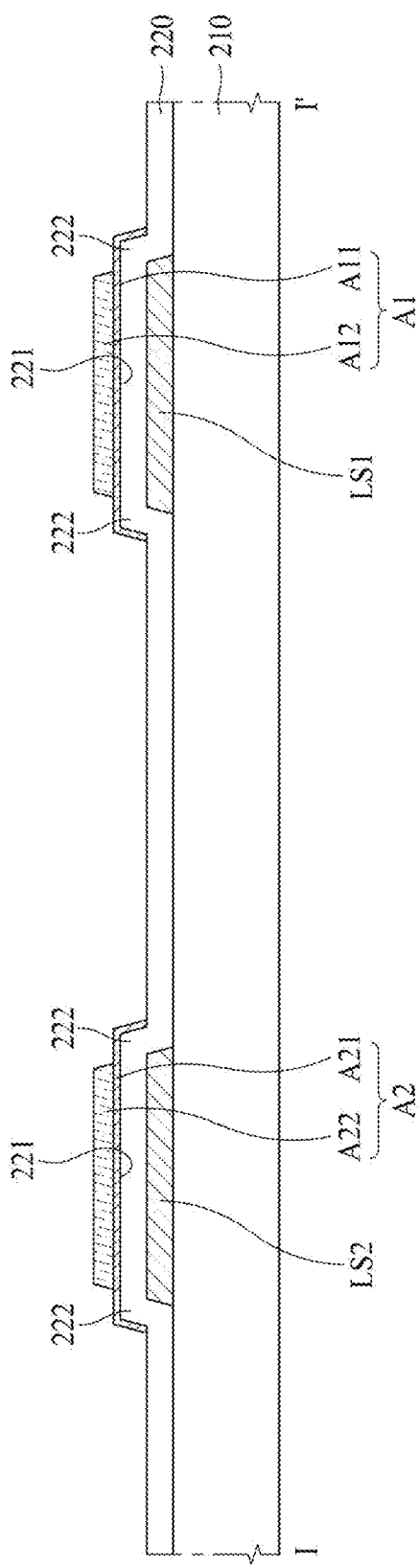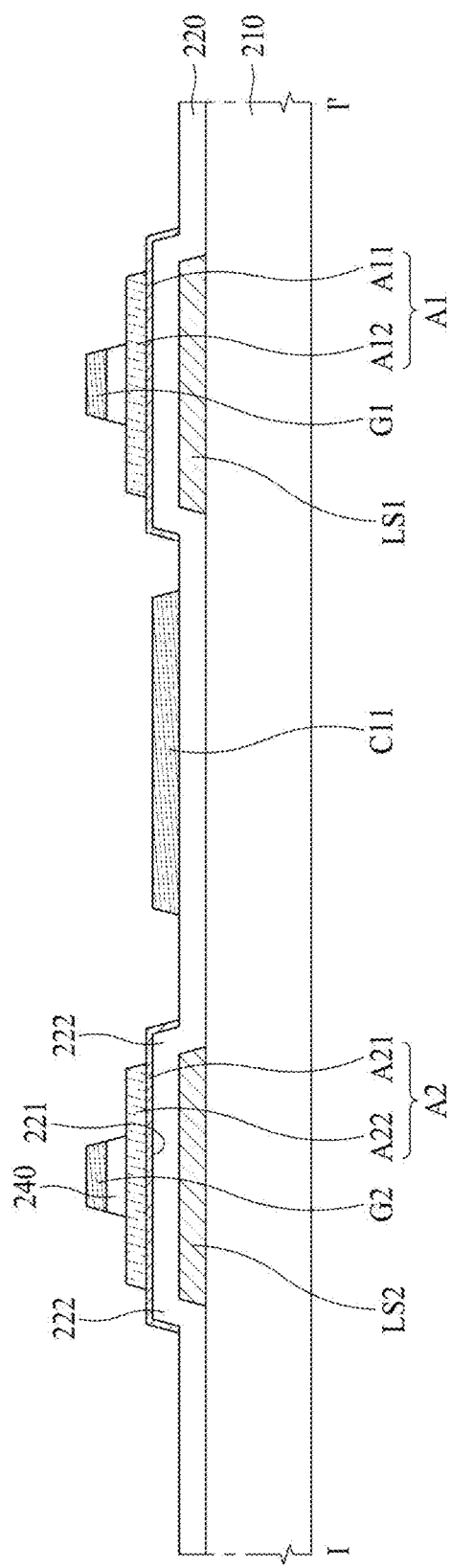

DISPLAY DEVICE COMPRISING THIN FILM TRANSISTORS AND METHOD FOR MANUFACTURING THE SAME

CROSS-REFERENCE TO RELATED APPLICATIONS

This application claims the benefit of priority to KR 10-2018-0135718, filed in Korea on Nov. 7, 2018, the disclosure of which is herein incorporated by reference in its entirety.

BACKGROUND

Technical Field

The present disclosure relates to a display device comprising a thin film transistor, and a method for manufacturing the same.

Description of the Related Art

A thin film transistor may be manufactured on a glass substrate or a plastic substrate, where it is widely used as a switching or driving device in a display device such as a liquid crystal display or an organic light emitting display.

According to a material used for the active layer, the thin film transistor may be generally categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

For the amorphous silicon thin film transistor (a-Si TFT), the amorphous silicon is deposited in a short time, and is formed as the active layer. Thus, the amorphous silicon thin film transistor (a-Si TFT) has advantages of short manufacturing time and low manufacturing cost. However, it may have disadvantages including inferior current driving efficiency due to low mobility, and a change of a threshold voltage. Thus, it may be difficult to use the amorphous silicon thin film transistor for an active matrix organic light emitting device (AMOLED).

The polycrystalline silicon thin film transistor (poly-Si TFT) may be obtained by depositing amorphous silicon and crystallizing the deposited amorphous silicon. The polycrystalline silicon thin film transistor has advantages of high electron mobility and great stability, realization of a thin profile and high resolution, and high power efficiency. The polycrystalline silicon thin film transistor may include a low temperature poly silicon (LTPS) thin film transistor, and a polysilicon thin film transistor. However, a process of manufacturing the polycrystalline silicon thin film transistor may need a step of crystallizing the amorphous silicon, whereby a manufacturing cost is increased due to the increased number of manufacturing steps. Also, it may have the disadvantage of crystallization at a high temperature. Thus, it may be difficult to apply the polycrystalline silicon thin film transistor to a large-sized display device.

The oxide semiconductor thin film transistor (Oxide semiconductor TFT), which has high mobility and has a large resistance change in accordance with an oxygen content, is advantageous in that it facilitates the obtaining of desired properties. Also, an active layer of oxide is formed at a relatively low temperature in the process of manufacturing the oxide semiconductor thin film transistor. Thus, it may be possible to lower the manufacturing cost. Also, owing to the properties of oxide, an oxide semiconductor is transparent, which is favorable for realizing a transparent display device. However, in comparison to the polycrystalline silicon thin film transistor, the oxide semiconductor thin film transistor may have relatively low stability and electron mobility.

Recently, as the pixel density is increased in devices such as high-resolution television or a mobile product, a large number of pixels are arranged in a small space, which may require a high-level stability for the manufacturing process. Thus, it may be necessary to increase the stability of a thin film transistor for the manufacturing process.

BRIEF SUMMARY

Accordingly, the present disclosure is directed to a display device comprising a thin film transistor, and a method for manufacturing the same that substantially obviate one or more of the problems due to limitations and disadvantages of the related art.

An object of the present disclosure to provide a display device which facilitates improving stability of a buffer layer or an insulating layer, and a method for manufacturing the same.

Another object of the present disclosure is to provide a display device including a semiconductor layer comprising a plurality of oxide semiconductor layers deposited in sequence, wherein a first oxide semiconductor layer corresponding to the lower positioned semiconductor layer functions as a physical protection film for damage to a buffer layer or insulating layer, to thereby improve a structural stability of the buffer layer or insulating layer.

It is another object of the present disclosure to provide a display device capable of preventing a short between a source electrode and a drain electrode by preventing an unnecessary electrical connection between another conductor and the source or drain electrode of a thin film transistor through an improved structural stability of a buffer layer or insulating layer.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a display device comprises a substrate; a pixel driver on the substrate; and a display element connected to the pixel driver, wherein the pixel driver includes a conductive layer on the substrate; a buffer layer on the conductive layer; a semiconductor layer on the buffer layer; a gate electrode, at least a part of the gate electrode overlapping at least a part of the semiconductor layer; and a source electrode and a drain electrode respectively connected to the semiconductor layer, wherein the buffer layer includes a flattened portion overlapping the conductive layer, and a stepped portion overlapping the periphery of the conductive layer, and wherein the semiconductor layer includes a first oxide semiconductor layer on the buffer layer, and a second oxide semiconductor layer on the first oxide semiconductor layer, wherein a width of the first oxide semiconductor layer is larger than a width of the second oxide semiconductor layer, and wherein at least a portion of the first oxide semiconductor layer is on the stepped portion of the buffer layer.

In another aspect, a method for manufacturing a display device comprises forming a conductive layer on a substrate; forming a buffer layer on the conductive layer; forming a first oxide semiconductor material layer and a second oxide semiconductor material layer on the buffer layer; forming a semiconductor layer by patterning the first oxide semiconductor material layer and the second oxide semiconductor material layer; and forming a gate insulating film and a gate electrode on the semiconductor layer, wherein a width of the first oxide semiconductor layer is larger than a width of the second oxide semiconductor layer; and wherein at least a portion of the first oxide semiconductor layer is disposed on a stepped portion of the buffer layer.

According to one embodiment of the present disclosure, the lower-positioned first oxide semiconductor layer included in the semiconductor layer functions as the physical protection film for damages on the buffer layer or insulating layer so that it is possible to improve the structural stability of the buffer layer or insulating layer.

According to another embodiment of the present disclosure, the structural stability of the buffer layer or insulating layer is improved so that it is possible to prevent the short between the source electrode and the drain electrode of the thin film transistor, thereby preventing defects in the display device, and improving driving stability.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 11A to 11F are cross sectional views illustrating a method for manufacturing a display device according to one embodiment of the present disclosure;

DETAILED DESCRIPTION

Figure 1:
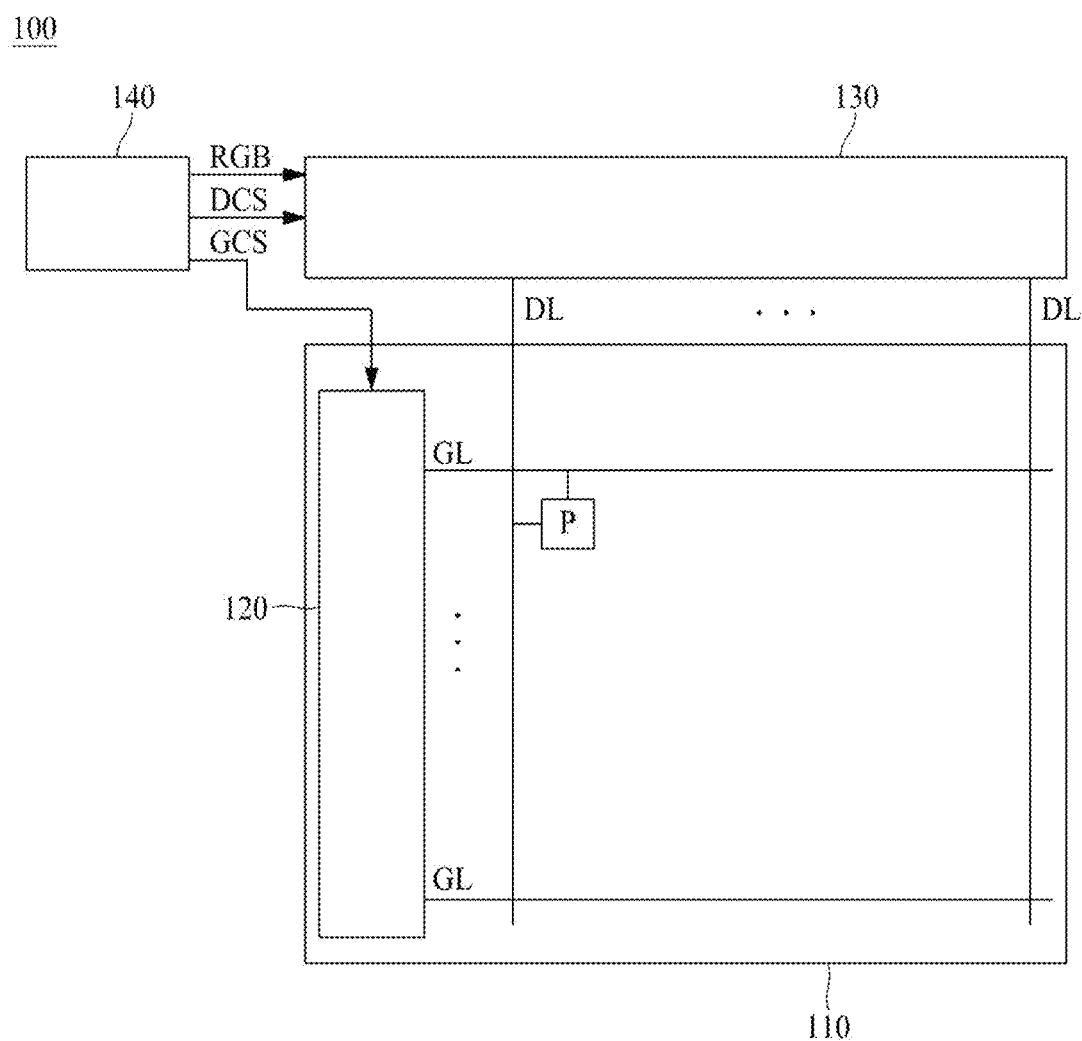
FIG. 1 is a schematic view illustrating a display device according to one embodiment of the present disclosure.

Reference will now be made in detail to the some embodiments of the present disclosure, examples of which are illustrated in the accompanying drawings.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic view illustrating a display device 100 according to one embodiment of the present disclosure. As shown in FIG. 1, the display device 100 according to one embodiment of the present disclosure includes a display panel 110, a gate driver 120, a data driver 130, and a controller 140.

The display panel 110 includes gate lines (GL) and data lines (DL), and a pixel (P) which is arranged at a crossing portion of the gate line (GL) and the data line (DL). The pixel (P) includes a display element 710 (see FIG. 2), and a pixel driver (PDC) configured to drive the display element 710. An image is displayed on the display panel 110 by driving the pixel (P).

The controller 140 controls the gate driver 120 and the data driver 130. The controller 140 outputs a gate control signal (GCS) for controlling the gate driver 120, and a data control signal (DCS) for controlling the data driver 130 by the use of a vertically/horizontally synchronized signal and a clock signal supplied from an external system (not shown). Also, the controller 140 samples input video data, which is provided from the external system, then re-aligns the sampled video data, and supplies the re-aligned digital video data (RGB) to the data driver 130.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into an analog data voltage, and supplies the analog data voltage to the data lines (DL).

The gate driver 120 sequentially supplies a gate pulse (GP) to the gate lines (GL) for one (1) frame period. Herein, "1 frame" indicates the period in which one image is output through the use of display panel 110. Also, the gate driver 120 supplies a gate-off signal for turning off a switching device to the gate line (GL) for the remaining period of 1 frame in which the gate pulse (GP) is not supplied. Hereinafter, the gate pulse (GP) and the gate-off signal (Goff) are referred to as scan signals (SS).

According to one embodiment of the present disclosure, the gate driver 120 may be provided on the display panel 110. A structure of directly providing the gate driver 120 on the display panel 110 may be referred to as a Gate-In-Panel (GIP) structure.

Figure 2:
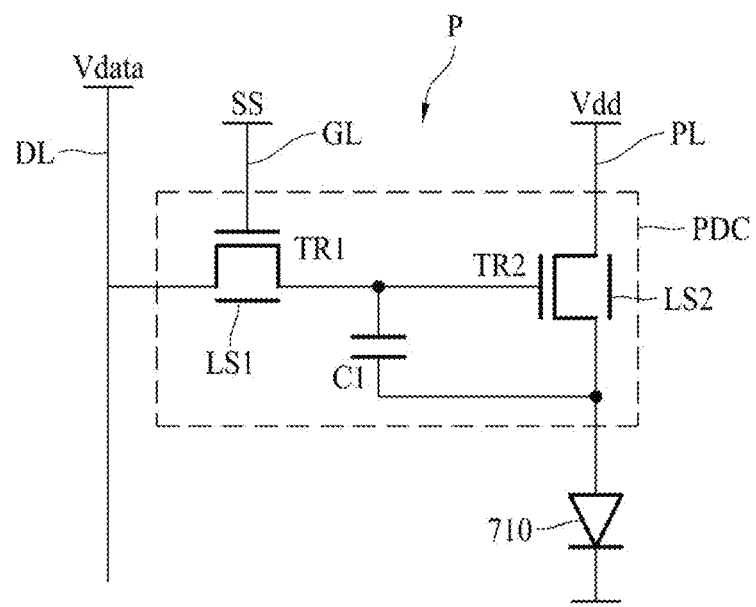
FIG. 2 is a circuit diagram for any one pixel of FIG. 1.
Figure 3:
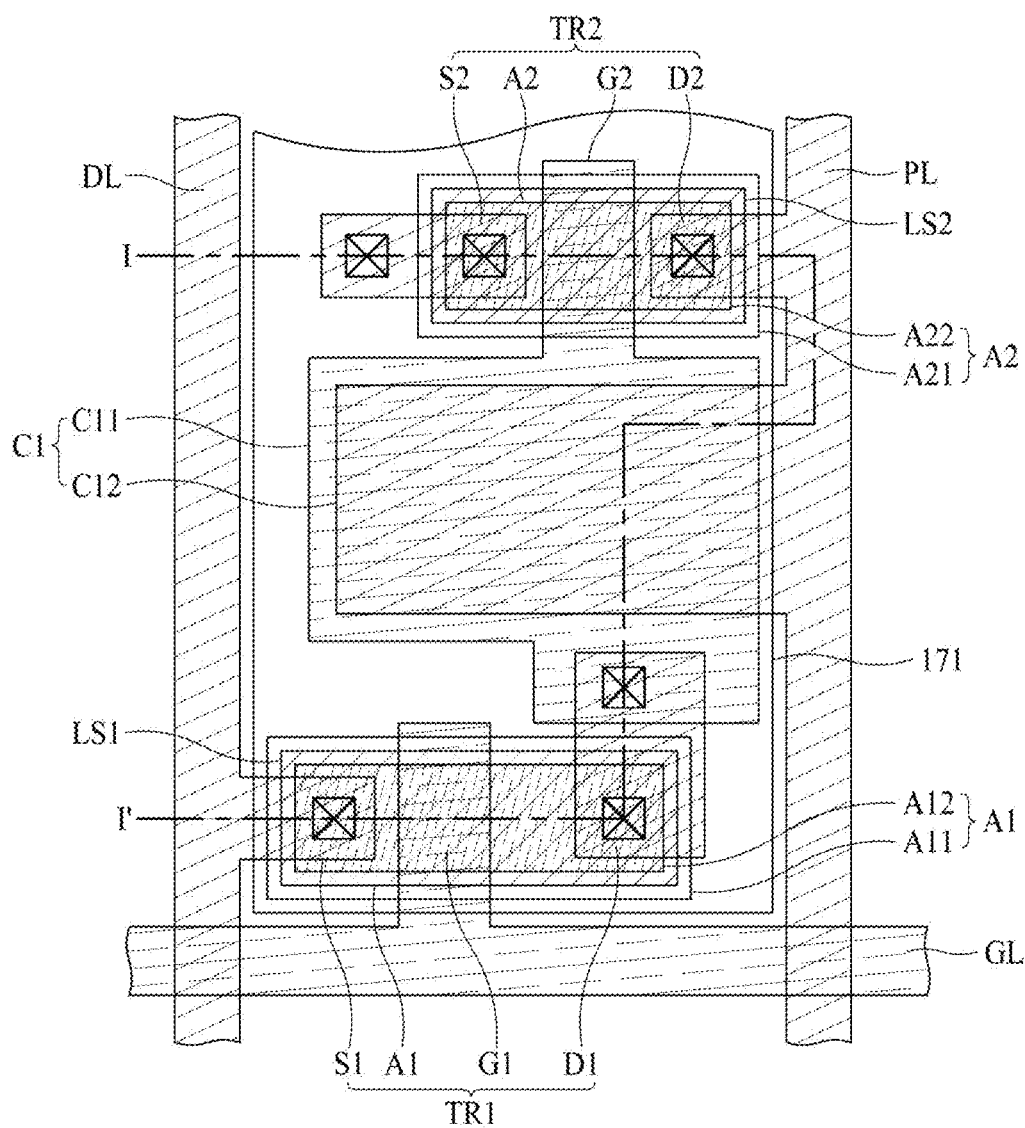
FIG. 3 is a plane view illustrating the pixel of FIG. 2.
Figure 4A:
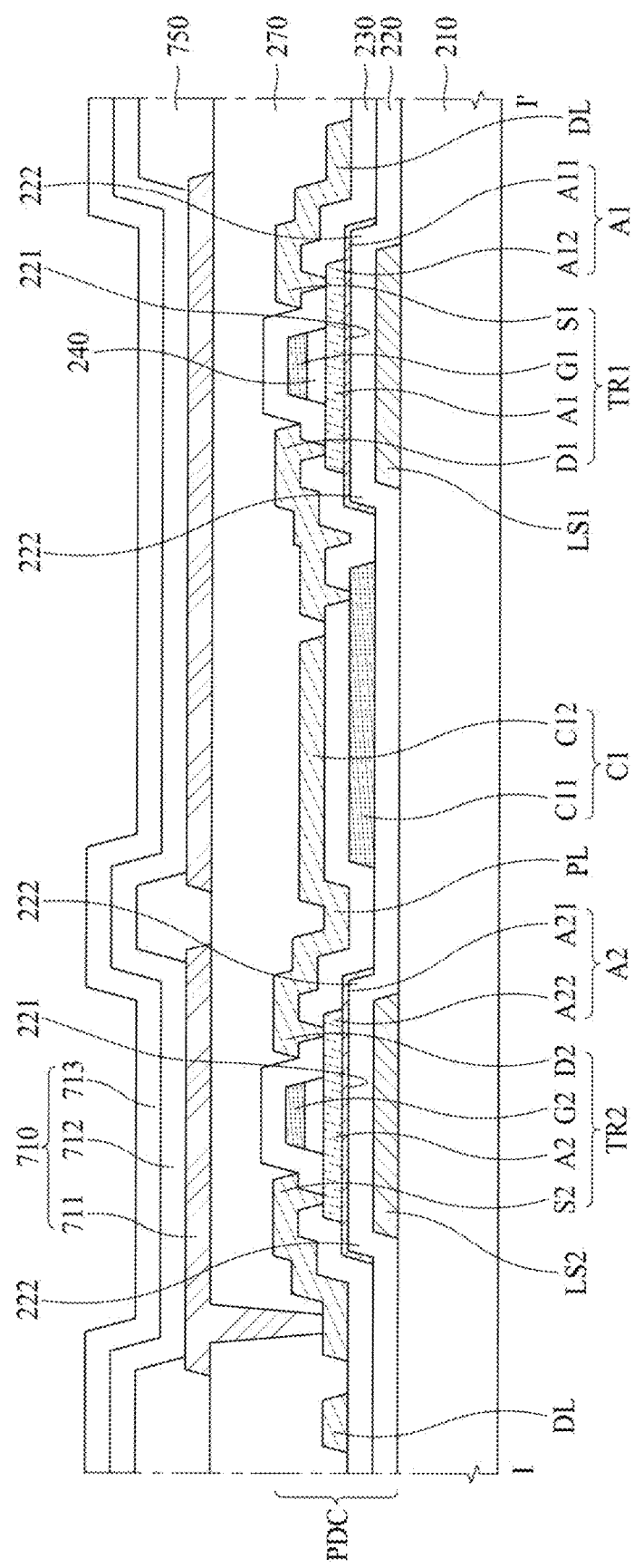
FIG. 4A is a cross sectional view along I-I' of FIG. 3.

FIG. 2 is a circuit diagram illustrating any one pixel (P) of FIG. 1, FIG. 3 is a plane view illustrating the pixel (P) of FIG. 2, and FIG. 4A is a cross sectional view along I-I' of FIG. 3.

With reference to FIGS. 2, 3, and 4A, the display device 100 according to one embodiment of the present disclosure may include a substrate 210, a pixel driver (PDC) on the substrate 210, and a display element 710 (or emission element) connected with the pixel driver (PDC). The pixel driver (PDC) includes thin film transistors (TR1, TR2).

The circuit diagram of FIG. 2 corresponds to an equivalent circuit diagram for one pixel (P1) in the display device 100 comprising an organic light emitting diode (OLED) functioning as the emission device 710. The pixel driver (PDC) of FIG. 2 includes a first thin film transistor (TR1) corresponding to a switching transistor, and a second thin film transistor (TR2) corresponding to a driving transistor.

The first thin film transistor (TR1) is connected with the gate line (GL) and the data line (DL), and the first thin film transistor (TR1) is turned on or turned off by the scan signal (SS) supplied through the gate line (GL).

The data line (DL) provides the data voltage (Vdata) to the pixel driver (PDC), and the first thin film transistor (TR1) controls applying the data voltage (Vdata).

A driving voltage line (PL) provides a driving voltage (Vdd) to the display element 710, and the second thin film transistor (TR2) controls the driving voltage (Vdd). Herein, the driving voltage (Vdd) is a pixel driving voltage for driving the organic light emitting diode (OLED) corresponding to the driving element 710.

The data voltage (Vdata), which is supplied through the data line (DL) when the first thin film transistor (TR1) is turned on, is supplied to a gate electrode (G2) of the second thin film transistor (TR2) connected with the emission element 710. The data voltage (Vdata) is charged in a first capacitor (C1) provided between a source electrode (S2) and the gate electrode (G2) of the second thin film transistor (TR2). The first capacitor (C1) corresponds to a storage capacitor (Cst).

An amount of current supplied to the organic light emitting diode (OLED) corresponding to the display element 710 through the second thin film transistor (TR2) is controlled in accordance with the data voltage (Vdd), whereby it is possible to control a grayscale of light emitted from the display element 710.

With reference to FIGS. 3 and 4A, the pixel driver (PDC) is disposed on the substrate 210. The substrate 210 may be formed of glass or plastic. For example, the substrate 210 may be formed of plastic having flexibility, for example, polyimide (PI).

The pixel driver (PDC) includes a conductive layer (LS1, LS2) on the substrate 210, a buffer layer 220 on the conductive layer (LS1, LS2), a semiconductor layer (A1, A2) on the buffer layer 220, a gate electrode (G1, G2), at least a part of the gate electrode overlapping with the semiconductor layer (A1, A2), and a source electrode (S1, S2) and a drain electrode (D1, D2) connected with the semiconductor layer (A1, A2).

The conductive layer (LS1, LS2) is formed of a conductive material such as metal. The conductive layer (LS1, LS2) may have light blocking properties. According to one embodiment of the present disclosure, the conductive layer (LS1, LS2) functions as a light blocking layer capable of blocking external light, and protecting the semiconductor layer (A1, A2). However, embodiments are not limited thereto. The conductive layer (LS1, LS2) may be any one of the lines (DL, GL, PL) configured to supply a signal to the pixel driver (PDC).

The buffer layer 220 is disposed on the conductive layer (LS1, LS2). The buffer layer 220 is formed of an insulating material, and protects the semiconductor layer (A1, A2) from externally-introduced moisture or oxygen. For example, the buffer layer 220 may be formed of an insulating material such as silicon oxide or silicon nitride. The buffer layer 220 prevents the conductive layer (LS1, LS2) from being electrically connected with other wirings or electrodes of the display device 100.

The buffer layer 220 includes a flattened portion 221 overlapped with the conductive layer (LS1, LS2), and a stepped portion 222 overlapped with the periphery of the conductive layer (LS1, LS2). The stepped portion 222 of the buffer layer 220 may be partially damaged or lost for a following process, for example, an etching process of the wirings or electrodes. If the stepped portion 222 of the buffer layer 220 is damaged or lost, it may be difficult to sufficiently protect the conductive layer (LS1, LS2) with the buffer layer 220, and this may cause a problem related to insulation of the conductive layer (LS1, LS2). Thus, according to one embodiment of the present disclosure, it may be possible to provide a structure capable of preventing the stepped portion 222 of the buffer layer 220 from being damaged or lost.

The semiconductor layer (A1) of the first thin film transistor (TR1) and the semiconductor layer (A2) of the second thin film transistor (TR2) are disposed on the buffer layer 220. The semiconductor layer (A1) of the first thin film transistor (TR1) is disposed while being overlapped with the first conductive layer (LS1). In order to protect the semiconductor layer (A1) of the first thin film transistor (TR1), in the plane structure, the semiconductor layer (A1) of the first thin film transistor (TR1) is completely covered by the first conductive layer (LS1).

The semiconductor layer (A2) of the second thin film transistor (TR2) is disposed while being overlapped with the second conductive layer (LS2). In order to protect the semiconductor layer (A2) of the second thin film transistor (TR2), in the plane structure, the semiconductor layer (A2) of the second thin film transistor (TR2) is completely covered by the second conductive layer (LS2).

The semiconductor layer (A1, A2) includes a first oxide semiconductor layer (A11, A21) on the buffer layer 220, and a second oxide semiconductor layer (A12, A22) on the first oxide semiconductor layer (A11, A21).

According to one embodiment of the present disclosure, the first oxide semiconductor layer (A11, A21) functions as a supporting layer for supporting the second oxide semiconductor layer (A12, A22), and the second oxide semiconductor layer (A12, A22) functions as a channel layer. A channel of the semiconductor layer (A1, A2) is generally formed in the second oxide semiconductor layer (A12, A22).

For a stable channel formation, the second oxide semiconductor layer (A12, A22) may be disposed on the flattened portion 221 of the buffer layer 220. In detail, the second oxide semiconductor layer (A12, A22) may be disposed in an area of the flattened portion 221 of the buffer layer 220 with respect to a plane view.

The second oxide semiconductor layer (A12, A22) may include an oxide semiconductor material. For example, the second oxide semiconductor layer (A12, A22) may include at least one among IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO (GaZnO)-based oxide semiconductor, and ITZO(InSnZnO)-based oxide semiconductor. However, embodiments are not limited thereto. The second oxide semiconductor layer (A12, A22) may be formed of other oxide semiconductor materials generally known to those in the art.

The first oxide semiconductor layer (A11, A21) may function as a protection layer for protecting the buffer layer 220, in addition to the supporting layer for supporting the second oxide semiconductor layer (A12, A22).

The first oxide semiconductor layer (A11, A21) may have a width which is larger than that of the second oxide semiconductor layer (A12, A22). According to one embodiment of the present disclosure, at least some portions of the first oxide semiconductor layer (A11, A21) may be disposed on the stepped portion 222 of the buffer layer 220. Accordingly, the first oxide semiconductor layer (A11, A21) may protect the stepped portion 222 of the buffer layer 220.

An etching process for forming the wirings or electrodes included in the pixel driver (PDC) may be carried out after a process for forming the semiconductor layer (A1, A2). In this example, the first oxide semiconductor layer (A11, A21) protects the stepped portion 222 of the buffer layer 220, to thereby prevent the stepped portion 222 of the buffer layer 220 from being lost by the etching process.

According to one embodiment of the present disclosure, in order to protect the stepped portion 222 of the buffer layer 220, the first oxide semiconductor layer (A11, A21) may be disposed while being extending from the flattened portion 221 of the buffer layer 220 to the stepped portion 222 of the buffer layer 220. Also, the first oxide semiconductor layer (A11, A21) may further extend from the stepped portion 222 of the buffer layer 220 in a direction far away from the second oxide semiconductor layer (A12, A22).

The first oxide semiconductor layer (A11, A21) for protecting the buffer layer 220 may have good film stability. For improvement of the film stability, the first oxide semiconductor layer (A11, A21) may include gallium (Ga), wherein gallium (Ga) forms a stabilized bond to oxygen, and gallium oxide has good film stability. Thus, if the oxide semiconductor layer includes gallium (Ga), it may be possible to realize good film stability and to improve tolerance to etching.

According to one embodiment of the present disclosure, the first oxide semiconductor layer (A11, A21) may include at least one among IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material.

For good film stability and improved tolerance to etching, the first oxide semiconductor layer (A11, A21) may include gallium (Ga) of 50 atom % or more than 50 atom % based on total metallic element with respect to number of atoms. If a content of the gallium (Ga) in the total metallic element of the first oxide semiconductor layer (A11, A21) is 50 atom % or more than 50 atom %, the first oxide semiconductor layer (A11, A21) may have good film stability and good tolerance to etching.

According to one embodiment of the present disclosure, all the metallic element of the first oxide semiconductor layer (A11, A21) may be gallium (Ga). In this case, the first oxide semiconductor layer (A11, A21) may be formed of GO(GaO)-based oxide semiconductor material, and the content of gallium (Ga) in the total metallic element of the first oxide semiconductor layer (A11, A21) may be 100 atom %.

In consideration of affinity with the second oxide semiconductor layer (A12, A22) and electrical stability of the first oxide semiconductor layer (A11, A21), the first oxide semiconductor layer (A11, A21) may include gallium (Ga) of 90 atom % or less than 90 atom % in comparison to a total metallic element.

According to one embodiment of the present disclosure, a concentration of gallium (Ga) in the first oxide semiconductor layer (A11, A21) is higher than a concentration of gallium (Ga) in the second oxide semiconductor layer (A12, A22).

The second oxide semiconductor layer (A12, A22) has electrical properties which are greater than that of the first oxide semiconductor layer (A11, A21), and has greater film stability and greater tolerance to etching than the first oxide semiconductor layer (A11, A21).

According to one embodiment of the present disclosure, under the same etching conditions, an etching rate of the first oxide semiconductor layer (A11, A21) is relatively lower than an etching rate of the second oxide semiconductor layer (A12, A22). Thus, under the same etching conditions, even though the second oxide semiconductor layer (A12, A22) is removed by etching, the first oxide semiconductor layer (A11, A21) may remain.

According to one embodiment of the present disclosure, a width of the first oxide semiconductor layer (A11, A21) may be relatively larger by 0.2 μm~5 μm in comparison to a width of the second oxide semiconductor layer (A21, A22).

The width of the first oxide semiconductor layer (A11, A21) may be changed in accordance with a width of the flattened portion 221 of the buffer layer 220, and also may be changed in accordance with a distance between the stepped portions 222 of the buffer layer 220.

If the width of the flattened portion 221 of the buffer layer 220 is similar to the width of the second oxide semiconductor layer (A12, A22), a difference in width between the first oxide semiconductor layer (A11, A21) and the second oxide semiconductor layer (A12, A22) may be small. However, if a difference in width between the first oxide semiconductor layer (A11, A21) and the second oxide semiconductor layer (A12, A22) is 0.2 μm or less than 0.2 μm, the flattened portion 221 of the buffer layer 220 may be not fully protected. Thus, according to one embodiment of the present disclosure, the width of the first oxide semiconductor layer (A11, A21) may be relatively larger by at least 0.2 μm in comparison to the width of the second oxide semiconductor layer (A12, A22).

Meanwhile, if the width of the first oxide semiconductor layer (A11, A21) is excessively large, it may be an obstacle to forming other wirings and contact holes. Thus, according to one embodiment of the present disclosure, when the width of the first oxide semiconductor layer (A11, A21) is larger than the width of the second oxide semiconductor layer (A12, A22), a difference in width between the first oxide semiconductor layer (A11, A21) and the second oxide semiconductor layer (A21, A22) may not exceed 5 μm. That is, a difference in width between the first oxide semiconductor layer (A11, A21) and the second oxide semiconductor layer (A12, A22) is 5 μm or less than 5 μm.

According to one embodiment of the present disclosure, the width of the first oxide semiconductor layer (A11, A21) is larger than a width of the conductive layer (LS1, LS2). If the conductive layer (LS1, LS2) serves as the light blocking layer, the width of the conductive layer (LS1, LS2) is larger than the width of the semiconductor layer (A1, A2) so as to protect the semiconductor layer (A1, A2), generally. However, according to one embodiment of the present disclosure, the width of the first oxide semiconductor layer (A11, A21) is larger than the width of the conductive layer (LS1, LS2) so as to protect the stepped portion 222 of the buffer layer 220.

A difference in width between the first oxide semiconductor layer (A11, A21) and the second oxide semiconductor layer (A12, A22) may be changed in accordance with an etching time period for the process of forming the semiconductor layer (A1, A2), a thickness of the first oxide semiconductor layer (A11, A21), and a content of the gallium (Ga) included in the first oxide semiconductor layer (A11, A21).

According to one embodiment of the present disclosure, the first oxide semiconductor layer (A11, A21) may have a thickness of 5 nm~25 nm. If the thickness of the first oxide semiconductor layer (A11, A21) is less than 5 nm, the stepped portion 222 of the buffer layer 220 may be not fully protected by the first oxide semiconductor layer (A11, A21), and the width of the first oxide semiconductor layer (A11, A21) may be not sufficiently ensured. Meanwhile, if the thickness of the first oxide semiconductor layer (A11, A21) is more than 25 nm, a total thickness of the semiconductor layer (A1, A2) is increased such that it may be unfavorable for thinness of the display device 100.

According to one embodiment of the present disclosure, the first oxide semiconductor layer (A11, A21) and the second oxide semiconductor layer (A12, A22) may be formed by metal-organic chemical vapor deposition (MOCVD). If the first oxide semiconductor layer (A11, A21) and the second oxide semiconductor layer (A12, A22)

are formed by metal-organic chemical vapor deposition (MOCVD), it may be possible to deposit the semiconductor layer (A1, A2) without any surface damage, and to realize a stable and fine film. Accordingly, it may be possible to efficiently protect the buffer layer 220 by the use of first oxide semiconductor layer (A11, A21).

With reference to FIG. 4A, a gate insulating film 240 is disposed on the semiconductor layer (A1, A2), wherein the gate insulating film 240 has insulating properties.

The gate electrode (G1, G2) is disposed on the gate insulating film 240. The gate electrode (G1, G2) may be a portion extending from the gate line (GL), or one portion of the gate line (GL).

A passivation layer 230 is disposed on the gate electrode (G1, G2), and a source electrode (S1, S2) and a drain electrode (D1, D2) are disposed on the passivation layer 230. According to one embodiment of the present disclosure, the source electrode (S1, S2) and the drain electrode (D1, D2) are distinguished from each other, for convenience of explanation. However, the terms source electrode (S1, S2) and drain electrode (D1, D2) may be used interchangeably. Thus, the source electrode (S1, S2) may be the drain electrode (D1, D2), and the drain electrode (D1, D2) may be the source electrode (S1, S2).

According to one embodiment of the present disclosure, the source electrode (Si) and the drain electrode (D1) included in the first thin film transistor (TR1) are spaced apart from each other, and are connected to the semiconductor layer (A1) of the first thin film transistor (TR1). The source electrode (S2) and the drain electrode (D2) included in the second thin film transistor (TR2) are spaced apart from each other, and are connected with the semiconductor layer (A2) of the second thin film transistor (TR2).

Also, the data line (DL) and the driving power line (PL) are disposed on the passivation layer 230. According to one embodiment of the present disclosure, the source electrode (Si) of the first thin film transistor (TR1) is connected with the data line (DL). The drain electrode (D2) of the second thin film transistor (TR2) is connected with the driving power line (PL).

According to one embodiment of the present disclosure, the stepped portion 222 of the buffer layer 220 is protected by the first oxide semiconductor layer (A11, A21), whereby it may be possible to prevent the stepped portion 222 of the buffer layer 220 from being lost, and to prevent a seam from occurring in the buffer layer 220 or the passivation layer 230. As a result, it may be possible to prevent a short between the conductive layer (LS1, LS2) and the source electrode (S1, S2), or between the conductive layer (LS1, LS2) and the drain electrode (D1, D2), to thereby prevent a short between the source electrode (S1, S2) and the drain electrode (D1, D2).

As shown in FIG. 4A, the first thin film transistor (TR1) includes the semiconductor layer (A1), the gate electrode (G1), the source electrode (Si), and the drain electrode (D1), and the first thin film transistor (TR1) functions as the switching transistor for controlling the data voltage (Vdata) applied to the pixel driver (PDC).

The second thin film transistor (TR2) includes the semiconductor layer (A2), the gate electrode (G2), the source electrode (S2), and the drain electrode (D2), and the second thin film transistor (TR2) functions as the driving transistor for controlling the driving voltage (Vdd) applied to the display element 710.

A planarization layer 270 is disposed on the source electrode (S1, S2), the drain electrode (D1, D2), the data line (DL), and the driving power line (PL). The planarization layer 270 is provided to planarize upper surfaces of the first thin film transistor (TR1) and the second thin film transistor (TR2), and to protect the first thin film transistor (TR1) and the second thin film transistor (TR2).

A first electrode 711 of the display element 710 is disposed on the planarization layer 270. The first electrode 711 of the display element 710 is connected with the source electrode (S2) of the second thin film transistor (TR2) through a contact hole provided in the planarization layer 270.

A bank layer 750 is disposed in the periphery of the first electrode 711. The bank layer 750 defines an emission area of the display element 710.

An emission layer 712 is disposed on the first electrode 711, and a second electrode 713 is disposed on the emission layer 712, whereby the display element 710 is completed. The display element 710 shown in FIG. 4A is an organic light emitting diode (OLED). Thus, the display device 100 according to one embodiment of the present disclosure corresponds to an organic light emitting display device.

In FIG. 4A, the first oxide semiconductor layer (A11, A21) extends from the flattened portion 221 of the buffer layer 220 to the stepped portion 222 of the buffer layer 220. FIG. 4A shows only one embodiment of the present disclosure, and embodiments are not limited to the structure of FIG. 4A. The first oxide semiconductor layer (A11, A21) may further extend from the stepped portion 222 of the buffer layer 220.

Figure 4B:
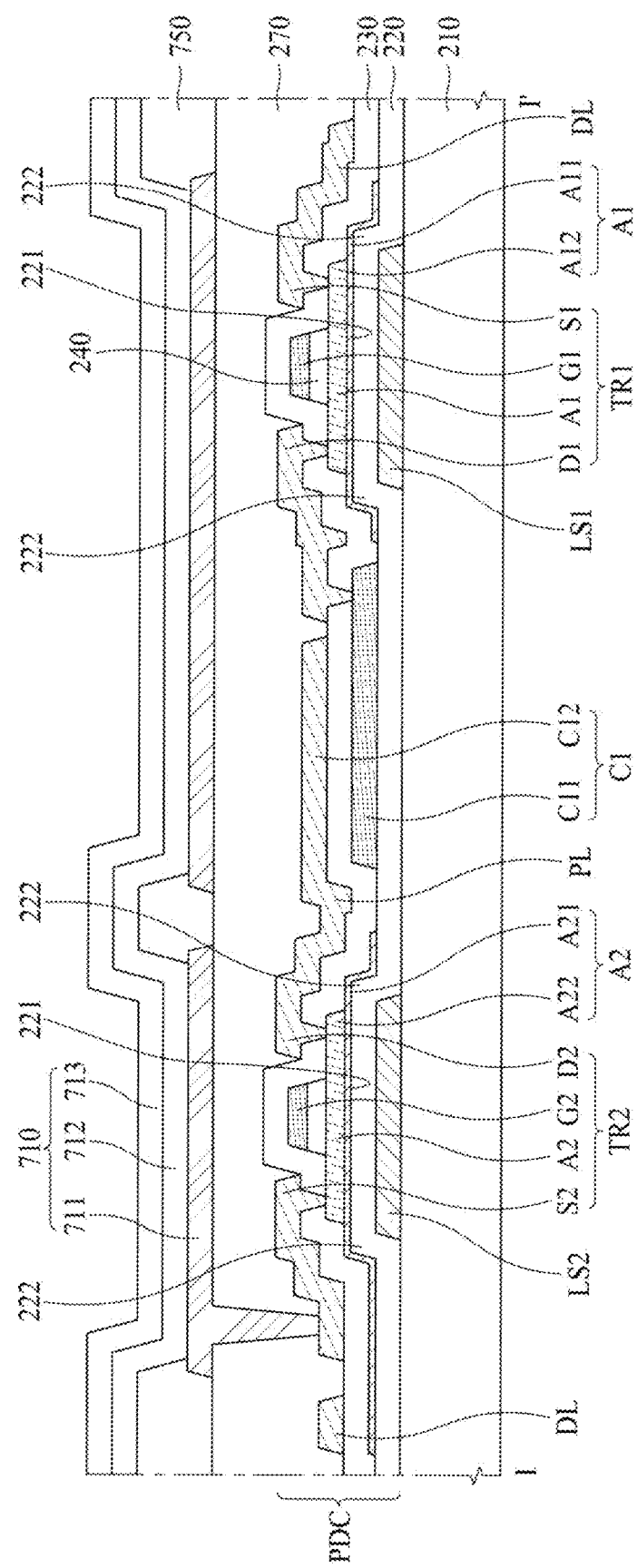
FIG. 4B is another cross sectional view along I-I' of FIG. 3.

FIG. 4B is another cross sectional view along I-I' of FIG. 3. With reference to FIG. 4B, the first oxide semiconductor layer (A11, A21) may further extend from the stepped portion 222 of the buffer layer 220 in a direction far away from the second oxide semiconductor layer (A12, A22). With the understanding that there may be no influence on operation of other elements of the pixel driver (PDC), there may be no restrictions on the extending range of the first oxide semiconductor layer (A11, A21).

For example, the first oxide semiconductor layer (A11, A21) may extend to be adjacent to the first capacitor (C1). However, in order to prevent unnecessary electrical instability caused by the extension of the first oxide semiconductor layer (A11, A21), the first oxide semiconductor layer (A11, A21) is not in contact with the first capacitor (C1), and is not positioned between two electrodes (C11, C12) of the first capacitor (C1).

Figure 5:
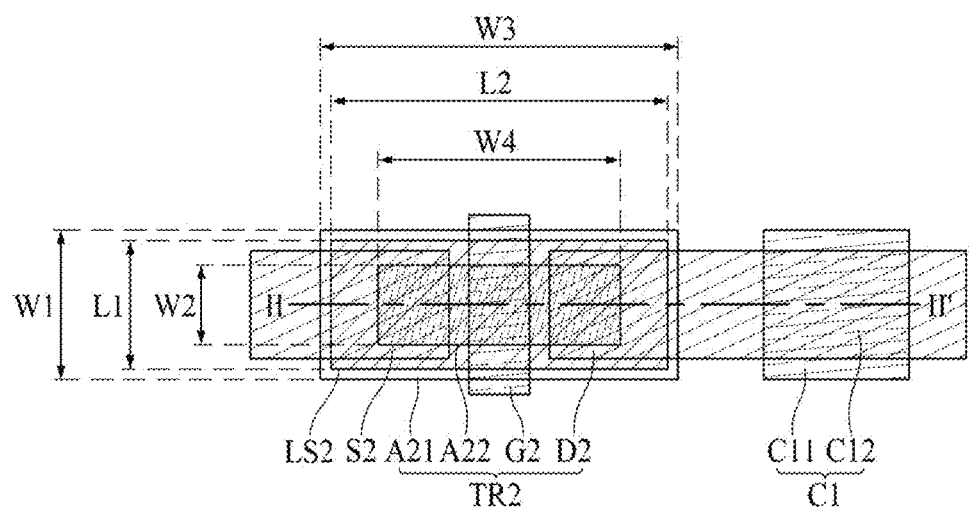
FIG. 5 is a schematic plane view illustrating a thin film transistor according to one embodiment of the present disclosure.
Figure 6A:
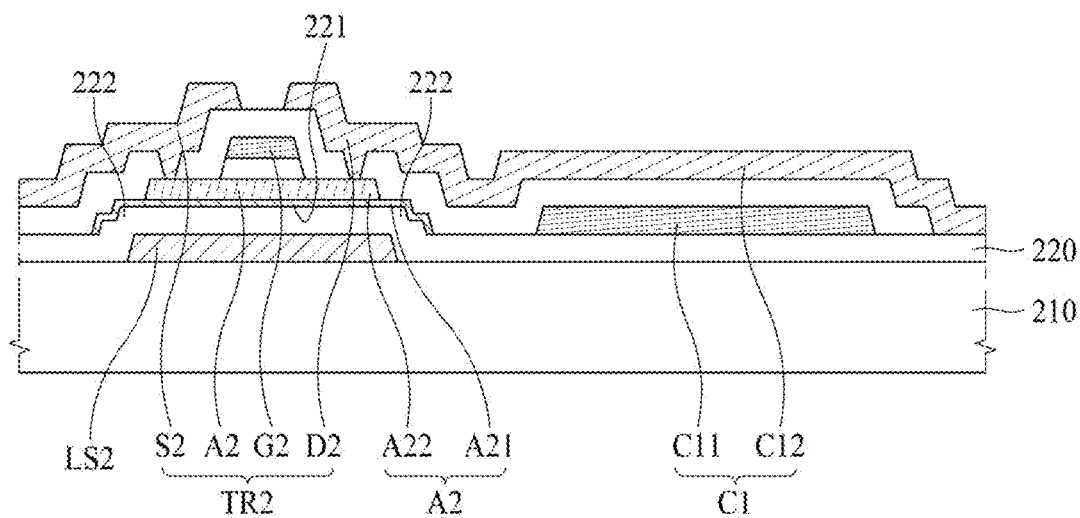
FIG. 6A is a cross sectional view along II-II' of FIG. 5.

FIG. 5 is a schematic plane view illustrating the thin film transistor (TR2) according to one embodiment of the present disclosure, and FIG. 6A is a cross sectional view along II-II' of FIG. 5.

According to one embodiment of the present disclosure, a width is defined by a distance between two confronting sides on a plane. In FIG. 5, 'w1', 'w2', and 'L1', which correspond to a distance between two sides in a vertical direction, indicates a width in each of the first oxide semiconductor layer (A21), the second oxide semiconductor layer (A22), and the conductive layer (LS2). Also, in FIG. 5, 'w3', 'w4', and 'L2', which correspond to a distance between two sides in a horizontal direction, indicates a width in each of the first oxide semiconductor layer (A21), the second oxide semiconductor layer (A22), and the conductive layer (LS2).

On comparison of the size in width, the widths in the horizontal direction may be compared, or the widths in the vertical direction may be compared. For example, if comparing the size in width, 'w1', 'w2', and 'L1' may be compared with one another, or 'w3', 'w4', and 'L2' may be compared with one another.

For example, if the width (w1, w3) of the first oxide semiconductor layer (A21) is larger than the width (w2, w4) of the second oxide semiconductor layer (A22), it may indicate "w1>w2", or "w3>w4".

With reference to FIGS. 5 and 6A, the width of the first oxide semiconductor layer (A21) may be larger than the width of the second oxide semiconductor layer (A22) (w1>w2, or w3>w4).

According to one embodiment of the present disclosure, the width of the first oxide semiconductor layer (A21) is larger than the width of the conductive layer (LS2) (w1>L1, or w3>L2).

According to one embodiment of the present disclosure, the width of the conductive layer (LS2) is larger than the width of the second oxide semiconductor layer (A22) (L1>w2, or L2>w4).

In FIGS. 5 and 6A, the first oxide semiconductor layer (A11, A21) extends from the flattened portion 221 of the buffer layer 220 to the stepped portion 222 of the buffer layer 220, but embodiments are not limited to this structure. The first oxide semiconductor layer (A11, A21) may further extend from the stepped portion 222 of the buffer layer 220.

Figure 6B:
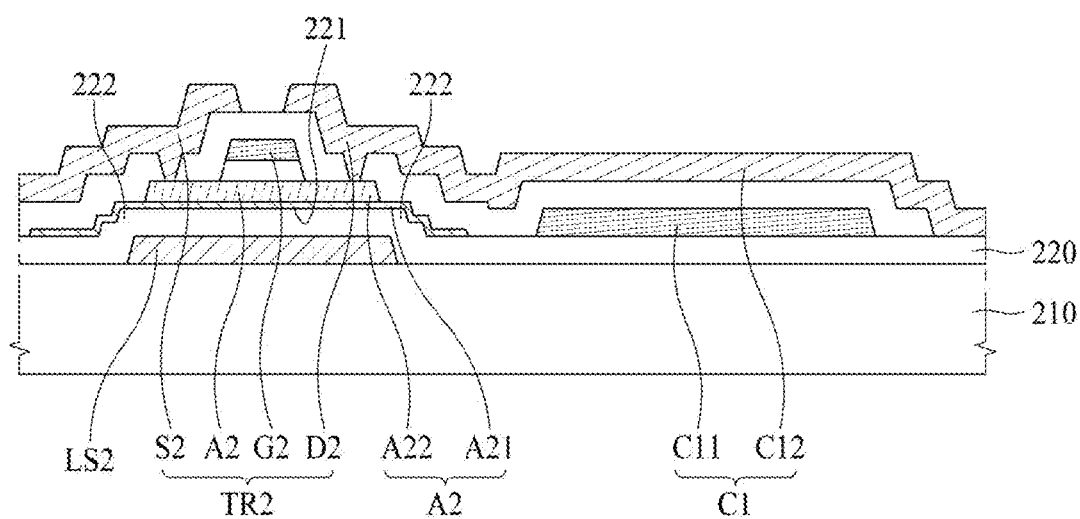
FIG. 6B is another cross sectional view along II-II' of FIG. 5.

FIG. 6B is another cross sectional view along of FIG. 5. With reference to FIG. 6B, the first oxide semiconductor layer (A11, A21) may further extend from the stepped portion 222 of the buffer layer 220 in a direction being far away from the second oxide semiconductor layer (A12, A22). With the understanding that there may be no influence on operation of other elements of the pixel driver (PDC), there may be no restrictions on the extending range of the first oxide semiconductor layer (A11, A21). For example, the first oxide semiconductor layer (A11, A21) may extend to be adjacent to the first capacitor (C1).

Figure 7A:
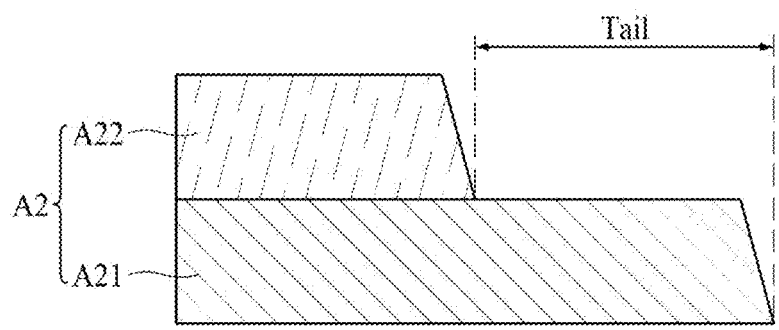
FIG. 7A is a cross sectional view illustrating the periphery of a semiconductor layer according to one embodiment of the present disclosure.
Figure 7B:
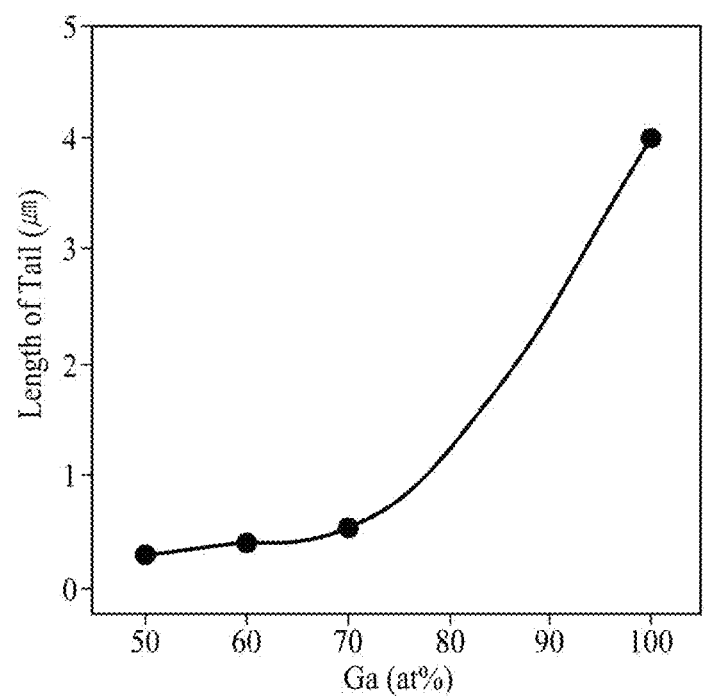
FIG. 7B is a graph illustration a relation between a length of a tail and a content of gallium (Ga) in a first oxide semiconductor layer.
Figure 7C:
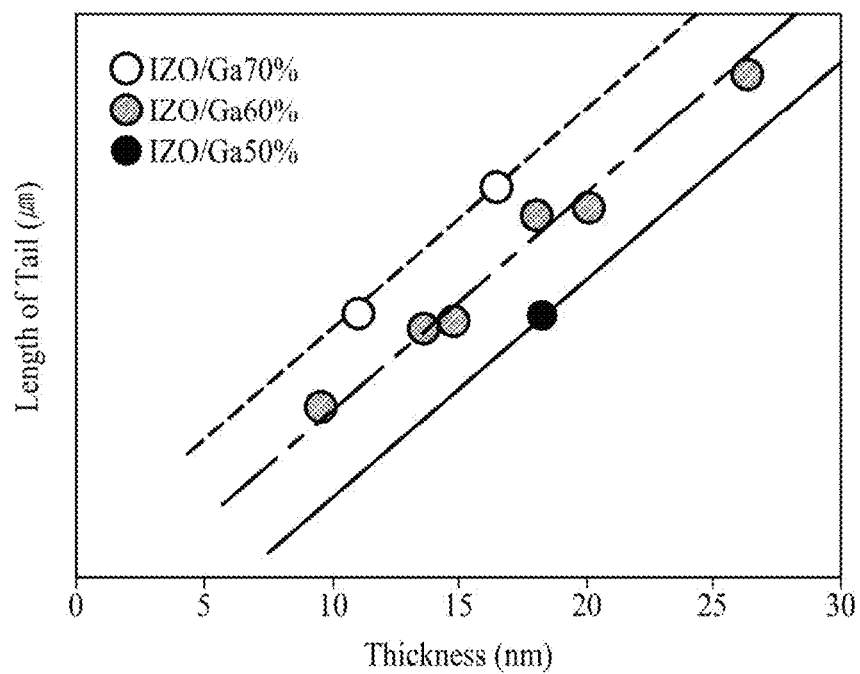
FIG. 7C is a graph illustrating a relation between a length of a tail and a thickness of a first oxide semiconductor layer.

FIG. 7A is a cross sectional view illustrating the periphery of the semiconductor layer (A2) according to one embodiment of the present disclosure, FIG. 7B is a graph illustration a relation between a length of a tail and a content of gallium (Ga) in the first oxide semiconductor layer (A21), and FIG. 7C is a graph illustrating a relation between a length of a tail and a thickness of the first oxide semiconductor layer (A21).

With reference to FIG. 7A, the width of the first oxide semiconductor layer (A21) is larger than the width of the second oxide semiconductor layer (A22). As a result, the first oxide semiconductor layer (A21) has a portion extending from an end portion of the second oxide semiconductor layer (A22), wherein the extending portion may be referred to as a tail. A length of the tail of the first oxide semiconductor layer (A21) corresponds to a difference in width between the first oxide semiconductor layer (A21) and the second oxide semiconductor layer (A22).

In an example where the semiconductor layer (A2) is patterned by depositing a material for forming the first oxide semiconductor layer (A21) and a material for forming the second oxide semiconductor layer (A22), and etching the material for forming the first oxide semiconductor layer (A21) together with the material for forming the second oxide semiconductor layer (A22), a length of the tail of the first oxide semiconductor layer (A21) may be changed in accordance with a content of gallium (Ga) included in the first oxide semiconductor layer (A21), and a thickness of the first oxide semiconductor layer (A21).

With reference to FIG. 7B, as a content (atom %) of gallium (Ga) included in the first oxide semiconductor layer (A21) is increased, a length of the tail of the first oxide semiconductor layer (A21) is also increased.

With reference to FIG. 7C, a length of the tail of the first oxide semiconductor layer (A21) is increased as a thickness of the first oxide semiconductor layer (A21) is increased, and a length of the tail of the first oxide semiconductor layer (A21) is increased as a content (atom %) of gallium included in the first oxide semiconductor layer (A21) is increased.

In FIG. 7C, a content ratio of indium (In) to zinc (Zn) included in the first oxide semiconductor layer (A21) is 1:1, and a content of gallium (Ga) is 50%, 60%, and 70% in based on total number of atoms of indium (In), zinc (Zn), and gallium (Ga).

Figure 8A:
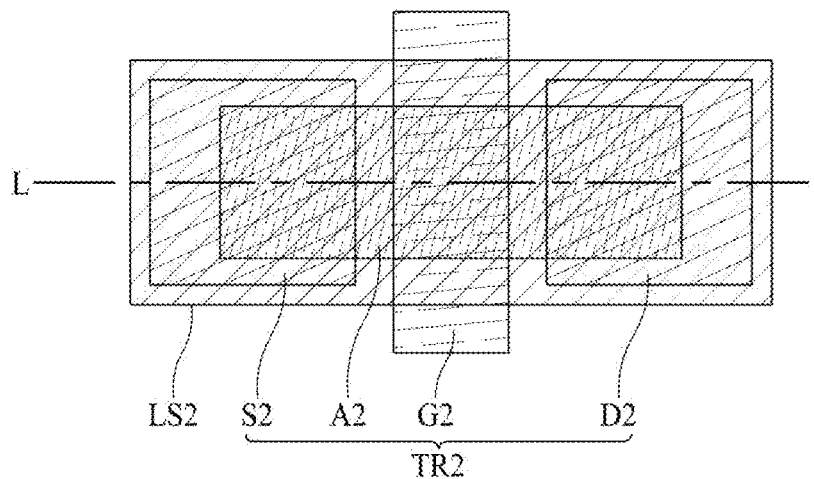
FIG. 8A is a schematic plane view illustrating a thin film transistor according to a comparative example.
Figure 8B:
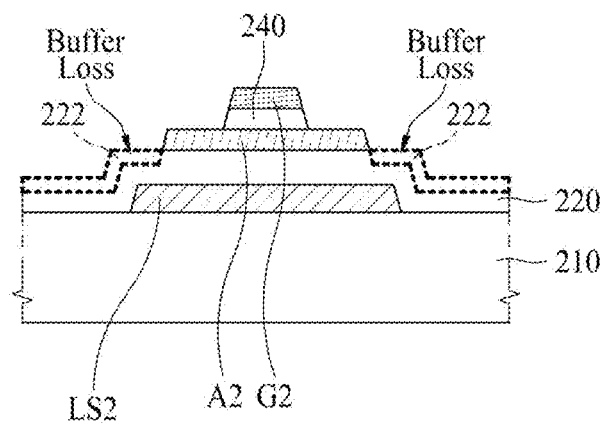
FIG. 8B is a cross sectional view along III-III' of FIG. 8A.
Figure 8C:
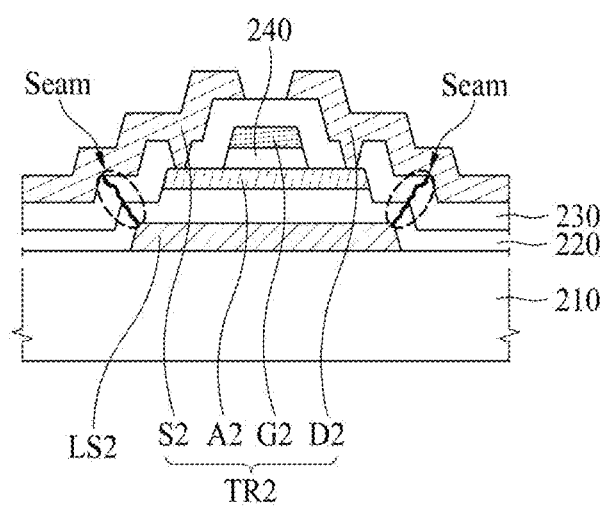
FIG. 8C is a schematic cross sectional view illustrating a seam occurrence.

FIG. 8A is a schematic plane view illustrating a thin film transistor according to a comparative example, FIG. 8B is a cross sectional view along III-III' of FIG. 8A, and FIG. 8C is a schematic cross sectional view illustrating a seam occurrence.

With reference to FIGS. 8A and 8B, a semiconductor layer (A2) is formed in a single-layered structure, and a width of the semiconductor layer (A2) is smaller than a width of a conductive layer (LS2).

With reference to FIG. 8B, the semiconductor layer (A2) may not protect a stepped portion 222 of a buffer layer 220. As a result, a loss of the buffer layer 220 may occur above the periphery of the conductive layer (LS2) in an etching process of forming a gate electrode (G2). If there is a loss of the buffer layer 220, a thickness of the buffer layer 220 above the periphery of the conductive layer (LS2) may become small, whereby the buffer layer 220 may be damaged.

With reference to FIG. 8C, a passivation layer 230 is disposed on the buffer layer 220, and a source electrode (S2) and a drain electrode (D2) are disposed on the passivation layer 230. If the buffer layer 220 is damaged and lost above the periphery of the conductive layer (LS2) due to the buffer loss of the buffer layer 220, a seam may be generated in the buffer layer 220 and the passivation layer 230. If the seam is present, a short may be generated between the conductive layer (LS2) and the source electrode (S2), and/or a short may be generated between the conductive layer (LS2) and the drain electrode (D2), whereby a short may be generated between the source electrode (S2) and the drain electrode (D2).

If a short is generated between the source electrode (S2) and the drain electrode (D2), it may cause defects on the second thin film transistor (TR2). If the defects are generated in the second thin film transistor (TR2), defects may be generated in the display device 100, to thereby deteriorate the picture quality of the display device 100.

Figure 9:
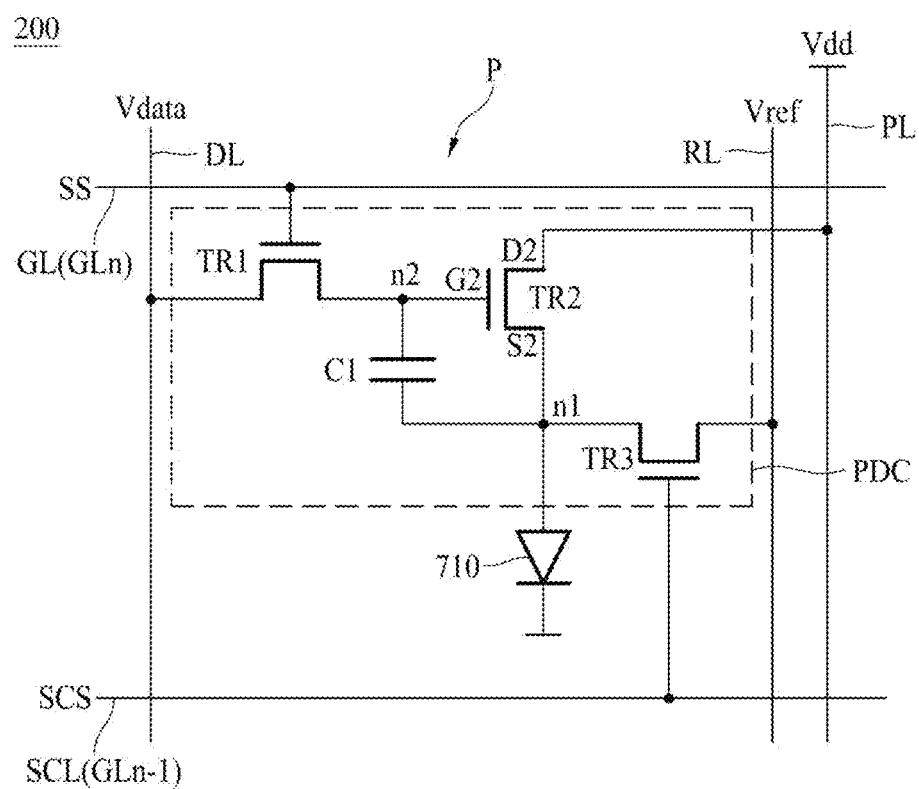
FIG. 9 is a circuit diagram illustrating a pixel of a display device according to another embodiment of the present disclosure.

FIG. 9 is a circuit diagram illustrating any one pixel (P) of a display device 200 according to another embodiment of the present disclosure. FIG. 9 is an equivalent circuit diagram for a pixel (P) of an organic light emitting display device.

The pixel (P) of the display device 200 shown in FIG. 9 includes an organic light emitting diode (OLED) corresponding to a display element 710, and a pixel driver (PDC) configured to drive the display element 710. The display element 710 is connected to the pixel driver (PDC).

In the pixel (P), there are signal lines (DL, GL, PL, RL, SCL) configured to supply signals to the pixel driver (PDC).

A data voltage (Vdata) is supplied to a data line (DL), a scan signal (SS) is supplied to a gate line (GL), a driving voltage (Vdd) for driving the pixel is supplied to a driving voltage line (PL), a reference voltage (Vref) is supplied to a reference line (RL), and a sensing control signal (SCS) is supplied to a sensing control line (SCL).

With reference to FIG. 9, when the gate line of the (n)th pixel (P) is referred to as "$GL_n$", the gate line of the neighboring (n−1)th pixel (P) is "$GL_{n-1}$", and "$GL_{n-1}$"

corresponding to the gate line of the (n−1)th pixel (P) serves as the sensing control line (SCL) of the (n)th pixel (P).

For example, as shown in FIG. 9, the pixel driver (PDC) includes a first thin film transistor (TR1, switching transistor) connected with the gate line (GL) and the data line (DL), a second thin film transistor (TR2, driving transistor) configured to control a level of current which is provided to the display element 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display element 710 and a gate electrode (G2) of the second thin film transistor (TR2). The first capacitor (C1) is referred to as a storage capacitor (Cst).

As the first thin film transistor (TR1) is turned on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) between the display element 710 and the second thin film transistor (TR2). The third thin film transistor (TR3) is turned on or turned off by the sensing control signal (SCS), and the third thin film transistor (TR3) senses the properties of the second thin film transistor (TR2) corresponding to the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned on, the current is supplied to the display element 710 through the second thin film transistor (TR2) by the driving voltage (Vdd) for driving the pixel, whereby light is emitted from the display element 710.

The first thin film transistor (TR1) and the second thin film transistor (TR2) shown in FIG. 9 may have the same deposition structure as that of the first thin film transistor (TR1) and the second thin film transistor (TR2) shown in FIGS. 3, 4A, and 4B.

Figure 10:
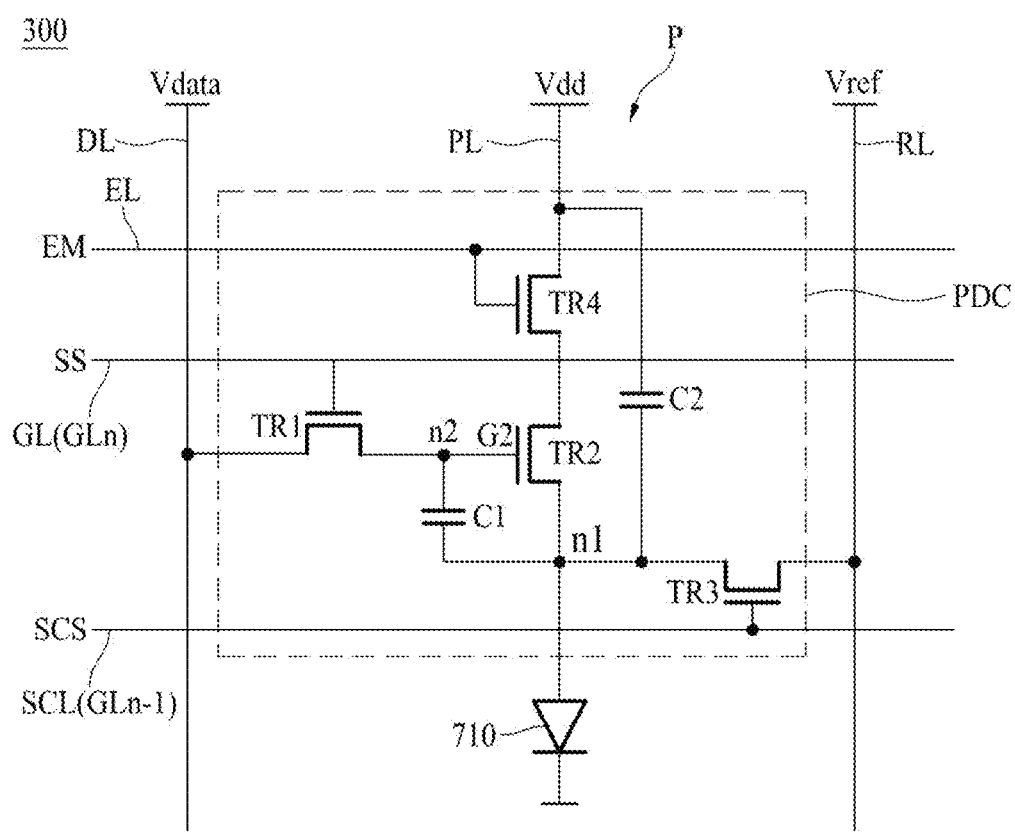
FIG. 10 is a circuit diagram illustrating a pixel of a display device according to another embodiment of the present disclosure.

FIG. 10 is a circuit diagram illustrating any one pixel (P) of a display device 300 according to another embodiment of the present disclosure. The pixel (P) of the display device 300 shown in FIG. 10 includes an organic light emitting diode (OLED) corresponding to a display element 710, and a pixel driver (PDC) configured to drive the display element 710. The display element 710 is connected with the pixel driver (PDC).

The pixel driver (PDC) includes thin film transistors (TR1, TR2, TR3, TR4). In the pixel (P), there are signal lines (DL, EL, GL, PL, SCL, RL) configured to supply signals to the pixel driver (PDC).

In comparison to the pixel (P) of FIG. 9, the pixel (P) of FIG. 10 further includes an emission control line (EL). An emission control signal (EM) is supplied to the emission control line (EL).

Also, in comparison to the pixel driver (PDC) of FIG. 9, the pixel driver (PDC) of FIG. 10 further includes a fourth thin film transistor (TR4) corresponding to an emission control transistor configured to control a light emission time point of the second thin film transistor (TR2).

With reference to FIG. 10, when the gate line of the (n)th pixel (P) is referred to as "$GL_n$", the gate line of the neighboring (n−1)th pixel (P) is "$GL_{n-1}$", and "$GL_{n-1}$" corresponding to the gate line of the (n−1)th pixel (P) serves as the sensing control line (SCL) of the (n)th pixel (P).

A first capacitor (C1) is positioned between the display element 710 and a gate electrode (G2) of the second thin film transistor (TR2). Also, a second capacitor (C2) is positioned between one electrode of the display element 710 and a terminal supplied with a driving voltage (Vdd) among terminals of the fourth thin film transistor (TR4).

As the first thin film transistor (TR1) is turned on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL). The third thin film transistor (TR3) is turned on or turned off by the sensing control signal (SCS), and the third thin film transistor (TR3) senses the properties of the second thin film transistor (TR2) corresponding to the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned on, the current is supplied to the second thin film transistor (TR2), whereby light is emitted from the display element 710.

The first thin film transistor (TR1) and the second thin film transistor (TR2) shown in FIG. 10 may have the same structure as that of the first thin film transistor (TR1) and the second thin film transistor (TR2) shown in FIGS. 3, 4A, and 4B.

The pixel driver (PDC) according to another embodiment of the present disclosure may be formed in various structures in addition to the above-described structure. For example, the pixel driver (PDC) may include five thin film transistors or more.

Hereinafter, a method for manufacturing the display device 100 according to one embodiment of the present disclosure will be described with reference to FIGS. 11A to 11F.

FIGS. 11A to 11F are cross sectional views illustrating a method for manufacturing the display device 100 according to one embodiment of the present disclosure.

With reference to FIG. 11A, the conductive layer (LS1, LS2) is formed on the substrate 210, and the buffer layer 220 is formed on the conductive layer (LS1, LS2). The conductive layer (LS1, LS2) functions as the light blocking layer. The buffer layer 220 includes the flattened portion 221 overlapped with the conductive layer (LS1, LS2), and the stepped portion 222 overlapped with the periphery of the conductive layer (LS1, LS2).

With reference to FIG. 11B, a first oxide semiconductor material layer 251 and a second oxide semiconductor material layer 252 are sequentially formed on the buffer layer 220. As a result, a semiconductor material layer 250 is formed.

The first oxide semiconductor material layer 251 may include at least one among IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material.

The second oxide semiconductor material layer 252 may include an oxide semiconductor material. For example, the second oxide semiconductor layer (A12, A22) may include at least one among IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor.

The first oxide semiconductor material layer 251 and the second oxide semiconductor material layer 252 may be formed by metal-organic chemical vapor deposition (MOCVD). As a result, it may be possible to provide the oxide semiconductor material layers 251 and 252 with good film quality.

A concentration of gallium (Ga) in the first oxide semiconductor material layer 251 is higher than a concentration of gallium (Ga) in the second oxide semiconductor material layer 252. The first oxide semiconductor material layer 251 may include gallium (Ga) of 50 atom % or more than 50 atom % based on total metallic element with respect to number of atoms.

The first oxide semiconductor material layer 251 may have a thickness of 5 nm 25 nm.

With reference to FIG. 11C, the semiconductor layer (A1, A2) is formed by patterning the first oxide semiconductor material layer 251 and the second oxide semiconductor material layer 252. The semiconductor layer (A1, A2) includes the first oxide semiconductor layer (A11, A21) and the second oxide semiconductor layer (A12, A22).

The semiconductor layer (A1) of the first thin film transistor (TR1) is disposed while being overlapped with the first conductive layer (LS1). The semiconductor layer (A2) of the second thin film transistor (TR2) is disposed while being overlapped with the second conductive layer (LS2).

The first oxide semiconductor layer (A11, A21) has a width which is relatively larger than that of the second oxide semiconductor layer (A12, A22). At least some portions of the first oxide semiconductor layer (A11, A21) may be disposed on the stepped portion 222 of the buffer layer 220. Accordingly, the first oxide semiconductor layer (A11, A21) covers and protects the stepped portion 222 of the buffer layer 220. However, one embodiment of the present disclosure is not limited to this structure. The first oxide semiconductor layer (A11, A21) may further extend from the stepped portion 222 of the buffer layer 220 (see FIGS. 4B and 6B).

With reference to FIG. 11D, the gate insulating film 240 and the gate electrode (G1, G2) are formed on the semiconductor layer (A1, A2).

Figure 11E:
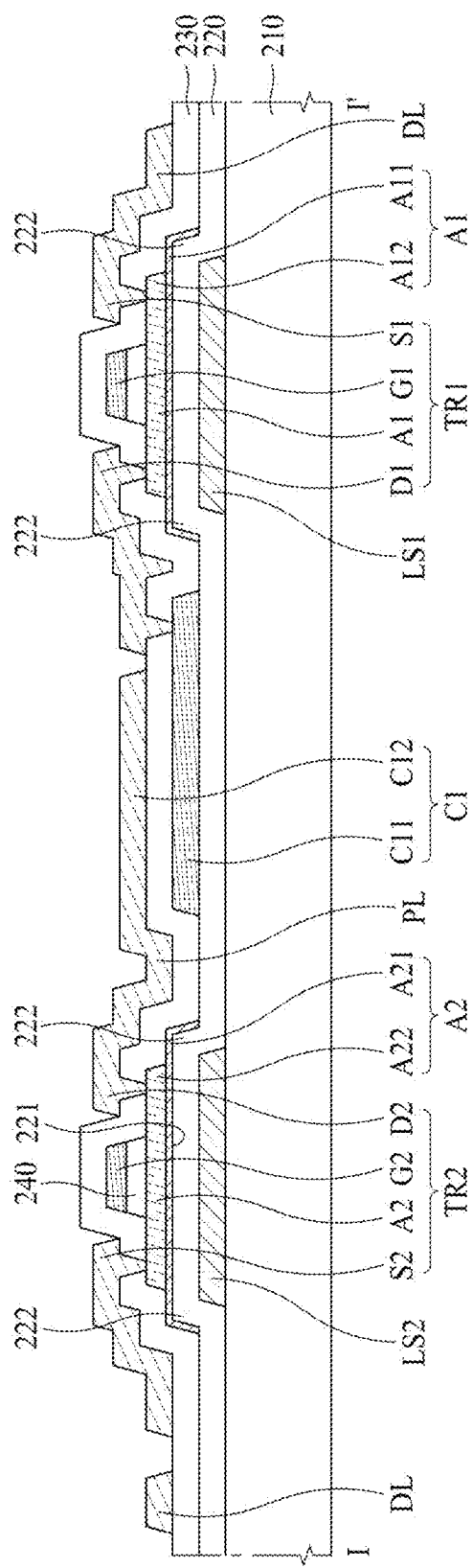

With reference to FIG. 11E, the passivation layer 230 is formed on the gate electrode (G1, G2), and the source electrode (S1, S2) and the drain electrode (D1, D2) are formed on the passivation layer 230. The source electrode (S1) and the drain electrode (D1) included in the first thin film transistor (TR1) are spaced apart from each other, and are connected with the semiconductor layer (A1) of the first thin film transistor (TR1). The source electrode (S2) and the drain electrode (D2) included in the second thin film transistor (TR2) are spaced apart from each other, and are connected with the semiconductor layer (A2) of the second thin film transistor (TR2).

Also, the data line (DL) and the driving power line (PL) are formed on the passivation layer 230. The source electrode (S1) of the first thin film transistor (TR1) is connected with the data line (DL), and the drain electrode (D2) of the second thin film transistor (TR2) is connected with the driving power line (PL).

According to one embodiment of the present disclosure, the stepped portion 222 of the buffer layer 220 is protected by the first oxide semiconductor layer (A11, A21) so that it is possible to prevent the buffer loss of the buffer layer 220 in the stepped portion 222 of the buffer layer 220, and to prevent the seam from being generated in the buffer layer 220 or passivation layer 230. As a result, it is possible to prevent a short between the conductive layer (LS1, LS2) and the source electrode (S1, S2), and/or between the conductive layer (LS1, LS2) and the drain electrode (D1, D2), thereby preventing a short between the source electrode (S1, S2) and the drain electrode (D1, D2).

By the process of FIG. 11E, it may be possible to complete the thin film transistor (TR1, TR2) comprising the gate electrode (G1, G2), the source electrode (S1, S2), and the drain electrode (D1, D2).

Figure 11F:
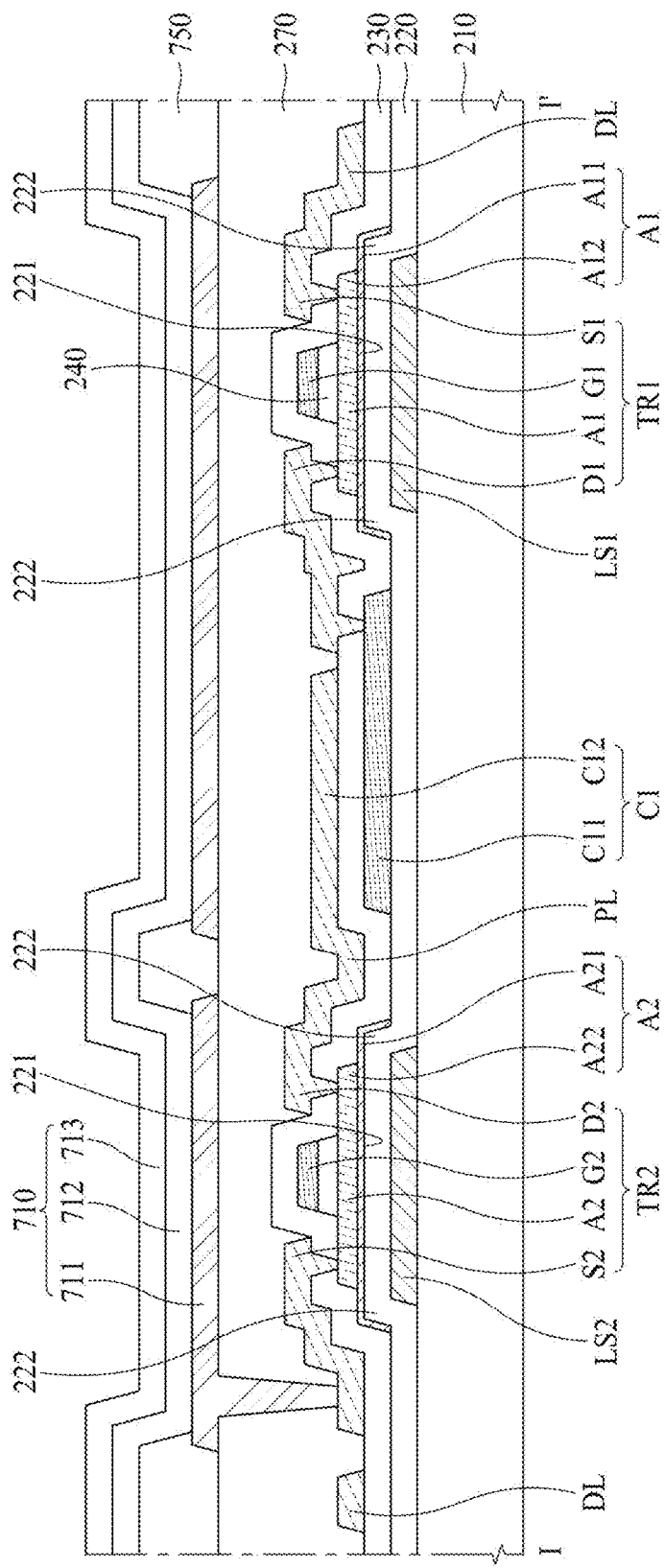

With reference to FIG. 11F, the planarization layer 270 is formed on the source electrode (S1, S2), the drain electrode (D1, D2), the data line (DL), and the driving power line (PL). A contact hole is formed in the planarization layer 270.

Also, the first electrode 711, the emission layer 712, and the second electrode 713 are sequentially formed on the planarization layer 270, to thereby form the display element 710. The bank layer 750 is formed in the periphery of the first electrode 711, to thereby define the emission area of the display element 710.

By the above process, the display element 710 is formed.

FIGS. 12A to 12D are cross sectional views illustrating a method for manufacturing a display device 100 according to another embodiment of the present disclosure.

Figure 12A:
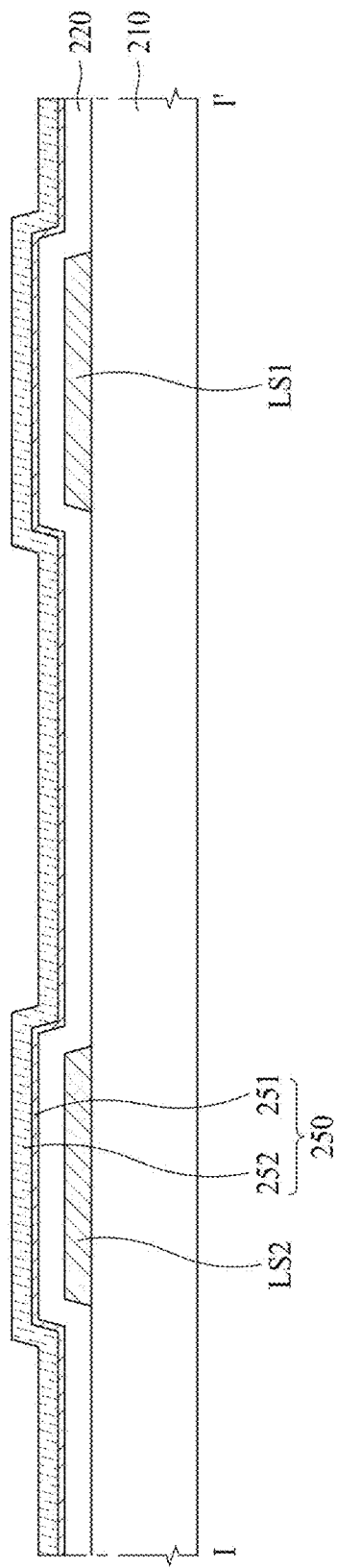
FIGS. 12A to 12D are cross sectional views illustrating a method for manufacturing a display device according to another embodiment of the present disclosure.

With reference to FIG. 12A, a conductive layer (LS1, LS2) is formed on a substrate 210, a buffer layer 220 is formed on the conductive layer (LS1, LS2), and a first oxide semiconductor material layer 251 and a second oxide semiconductor material layer 252 are sequentially formed on the buffer layer 220. FIG. 12A is obtained by combining FIGS. 11A and 11B. As a result, a semiconductor material layer 250 is formed.

Figure 12B:
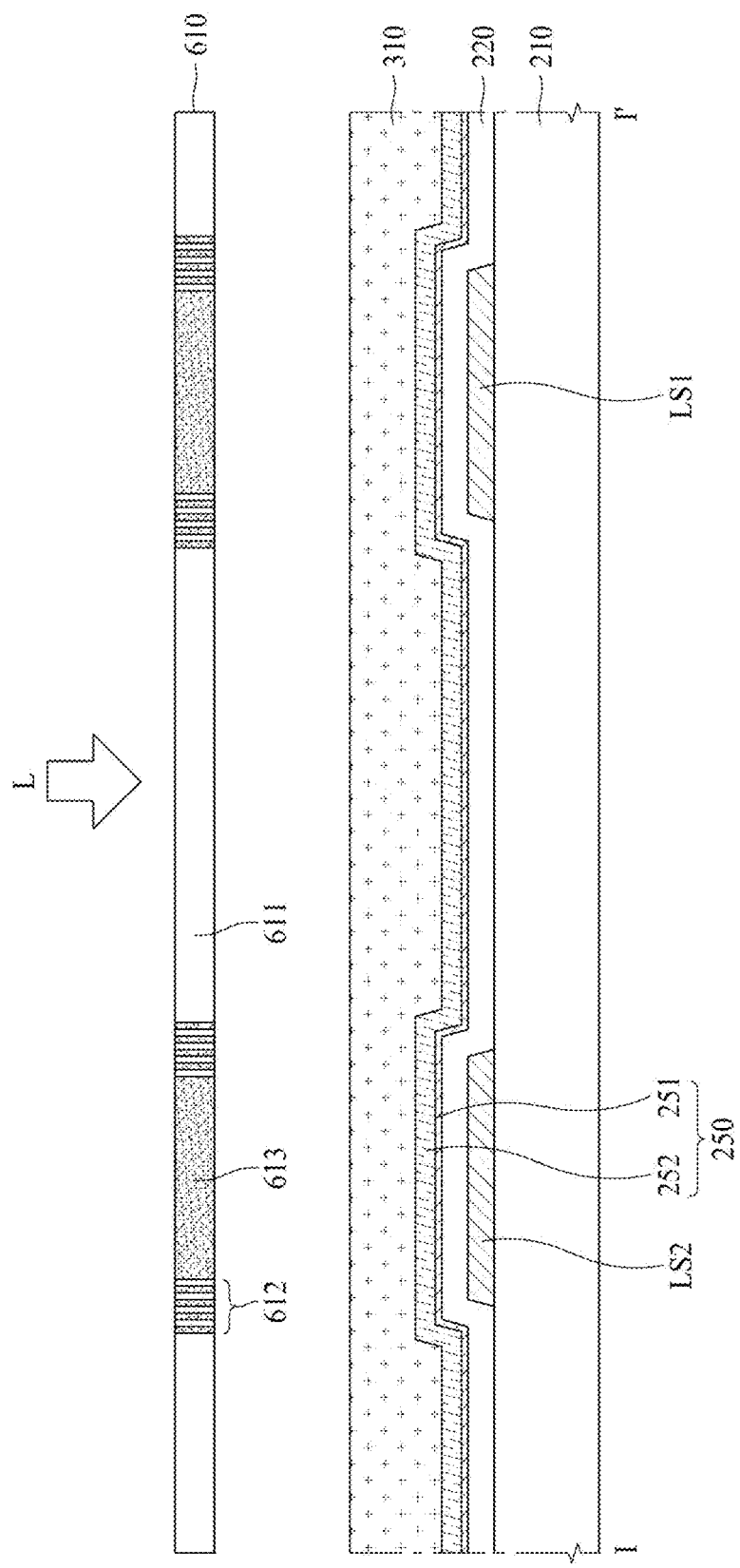

With reference to FIG. 12B, a photoresist layer (PR) 310 is formed on the semiconductor material layer 250. The photoresist layer (PR) 310 may be formed of a negative photoresist material or a positive photoresist material. According to one embodiment of the present disclosure, the photoresist layer 310 may be formed of the positive photoresist material.

A pattern mask 610 is disposed above the photoresist layer 310. Then, light (L) is irradiated through the pattern mask 610, whereby an exposure for the photoresist layer 310 is performed.

The pattern mask 610 may be a halftone mask. With reference to FIG. 11B, the pattern mask 610 may be the halftone mask comprising a transmitting portion 611, a semi-transmitting portion 612, and a light-blocking portion 613.

By the exposure using the pattern mask 610, the photoresist layer 310 is selectively exposed.

Figure 12C:
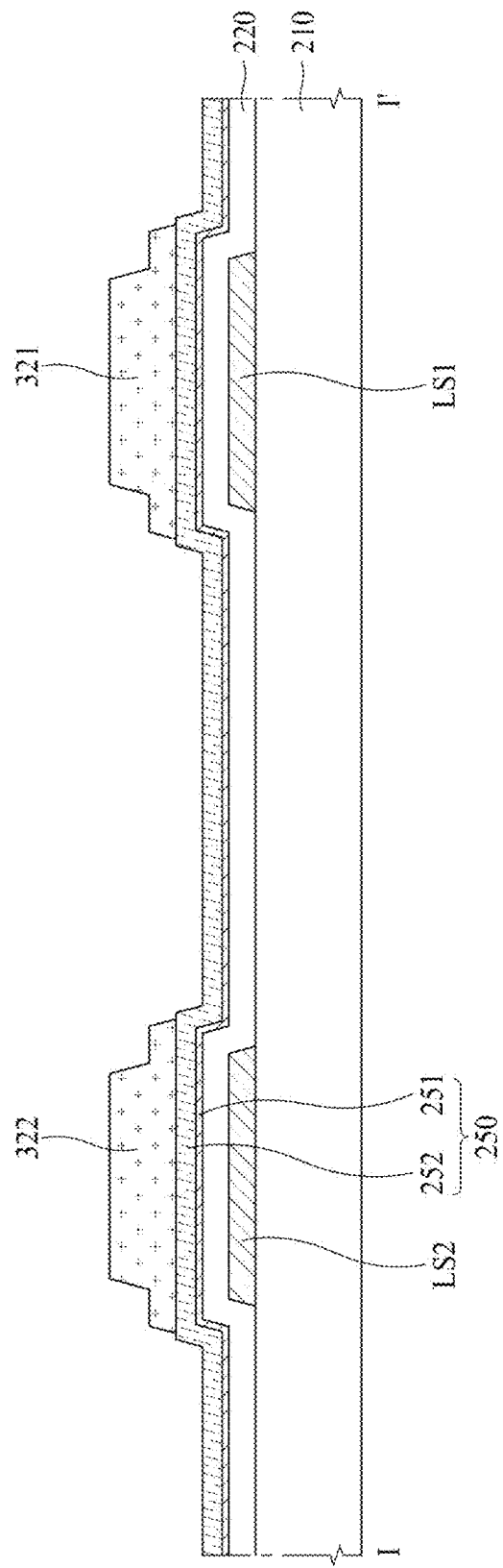

With reference to FIG. 12C, the selectively-exposed photoresist layer 310 is developed, to thereby form a photoresist pattern 321 and 322.

Figure 12D:
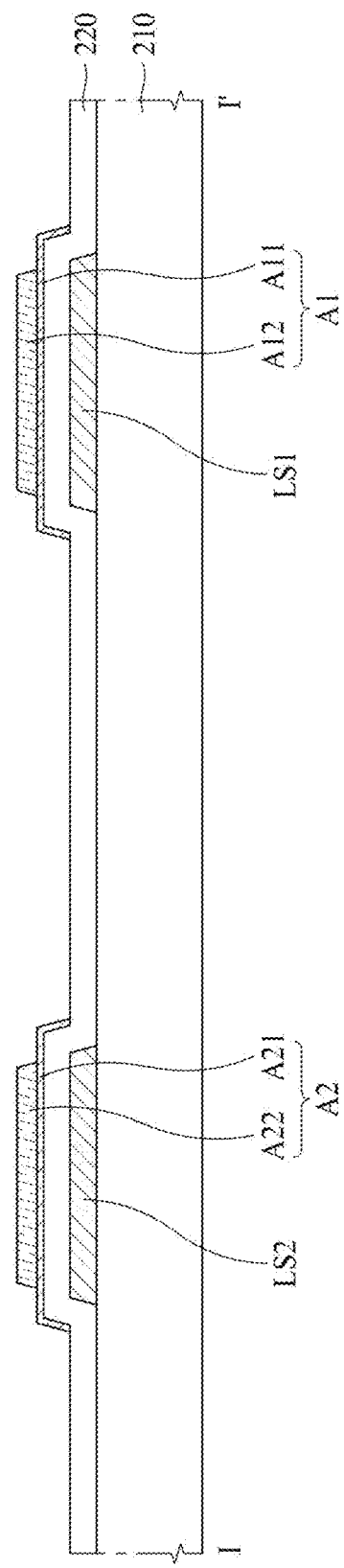

With reference to FIG. 12D, the first oxide semiconductor material layer 251 and the second oxide semiconductor material layer 252 are patterned by an etching process using the photoresist pattern 321 and 322 as a mask, to thereby form a semiconductor layer (A1, A2). The semiconductor layer (A1, A2) includes a first oxide semiconductor layer (A11, A21), and a second oxide semiconductor layer (A12, A22).

After that, the display device 100 may be manufactured by the same process as that of FIGS. 11D and 11F.

Figure 13A:
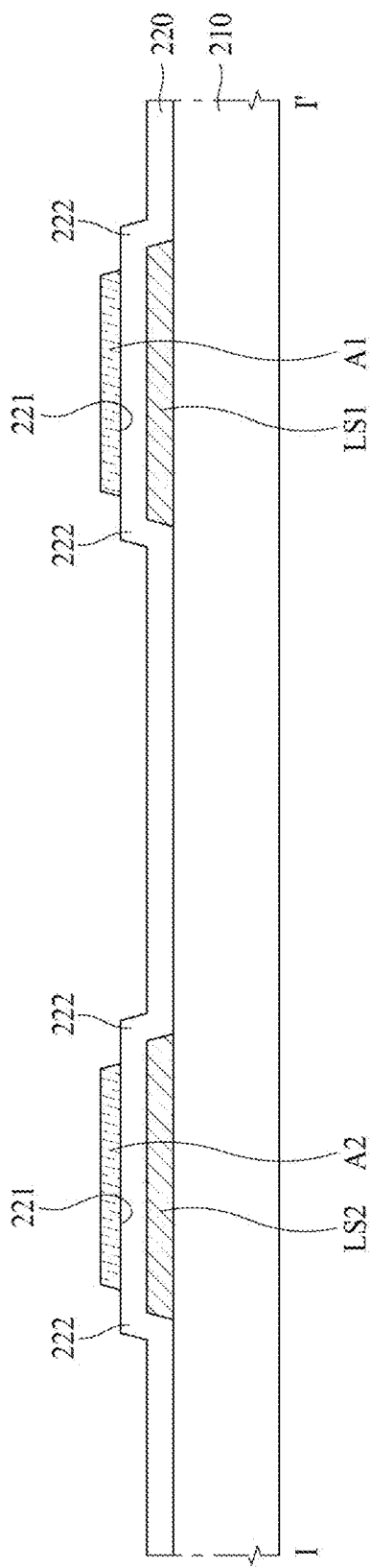
FIGS. 13A to 13F are cross sectional views illustrating a method for manufacturing a display device according to a comparative example.

FIGS. 13A to 13F are cross sectional views illustrating a method for manufacturing a display device according to a comparative example. With reference to FIG. 13A, a conductive layer (LS1, LS2) is formed on a substrate 210, a buffer layer 220 is formed on the conductive layer (LS1, LS2), and a semiconductor layer (A1, A2) is formed on the buffer layer 220.

In FIG. 13A, a width of the semiconductor layer (A1, A2) is smaller than a width of the conductive layer (LS1, LS2). Thus, a stepped portion 222 of the buffer layer 220 is not covered by the semiconductor layer (A1, A2).

Figure 13B:
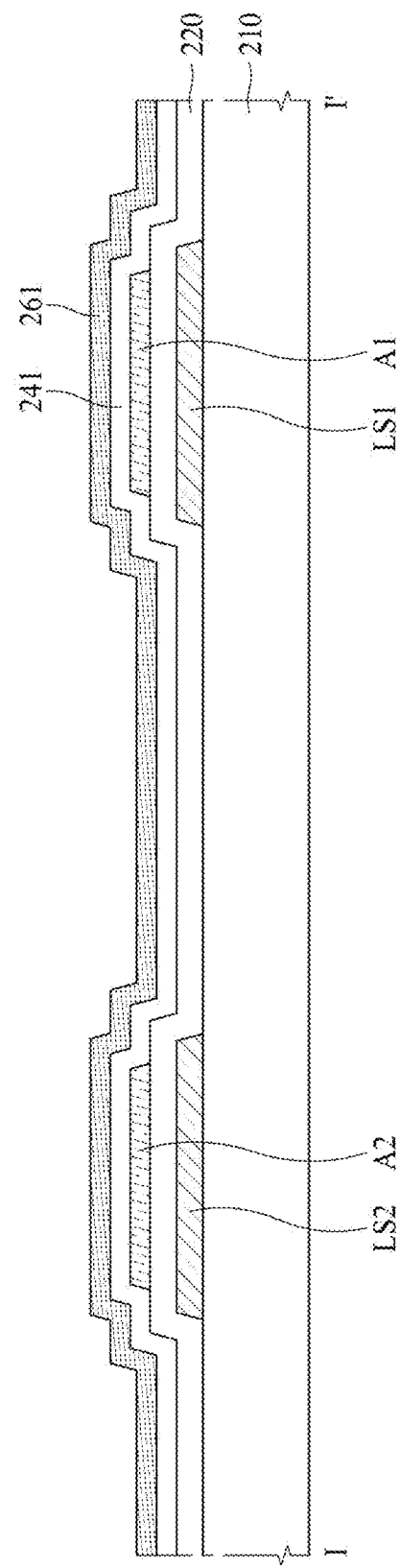

With reference to FIG. 13B, an insulating material layer 241 for a gate insulating film is formed on the semiconductor layer (A1, A2), and a conductive material layer 261 for a gate electrode is formed on the insulating material layer 241 for the gate insulating film.

Figure 13C:
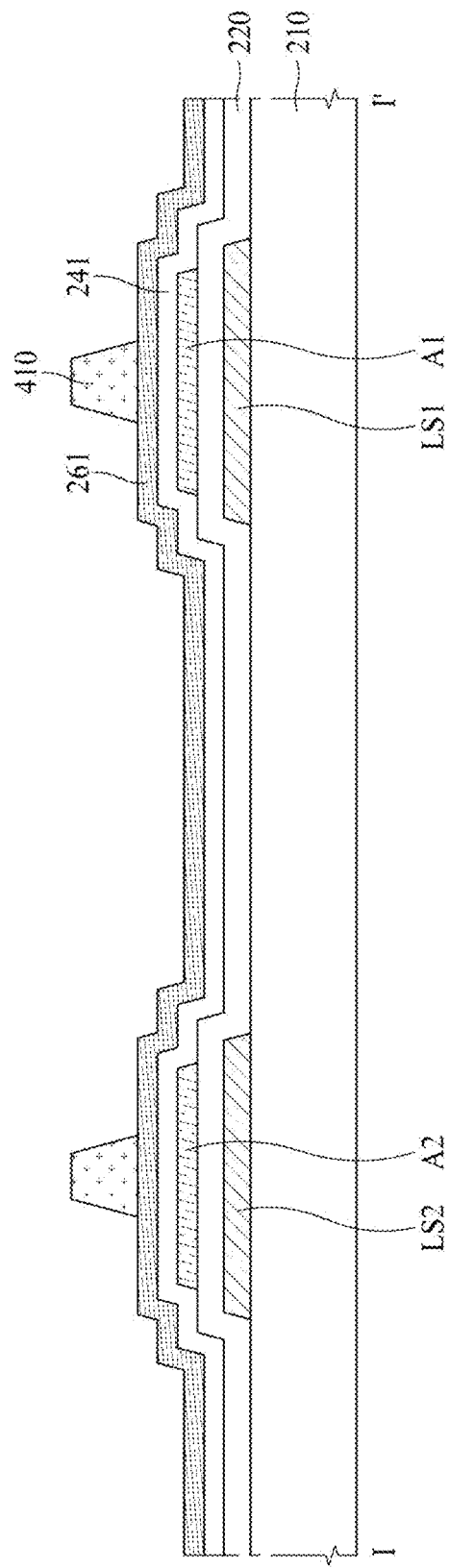

With reference to FIG. 13C, a photoresist pattern 410 is formed on the conductive material layer 261 for the gate electrode. Then, an etching process using the photoresist pattern 410 as a mask is performed so as to form a gate electrode (G1, G2).

Figure 13D:
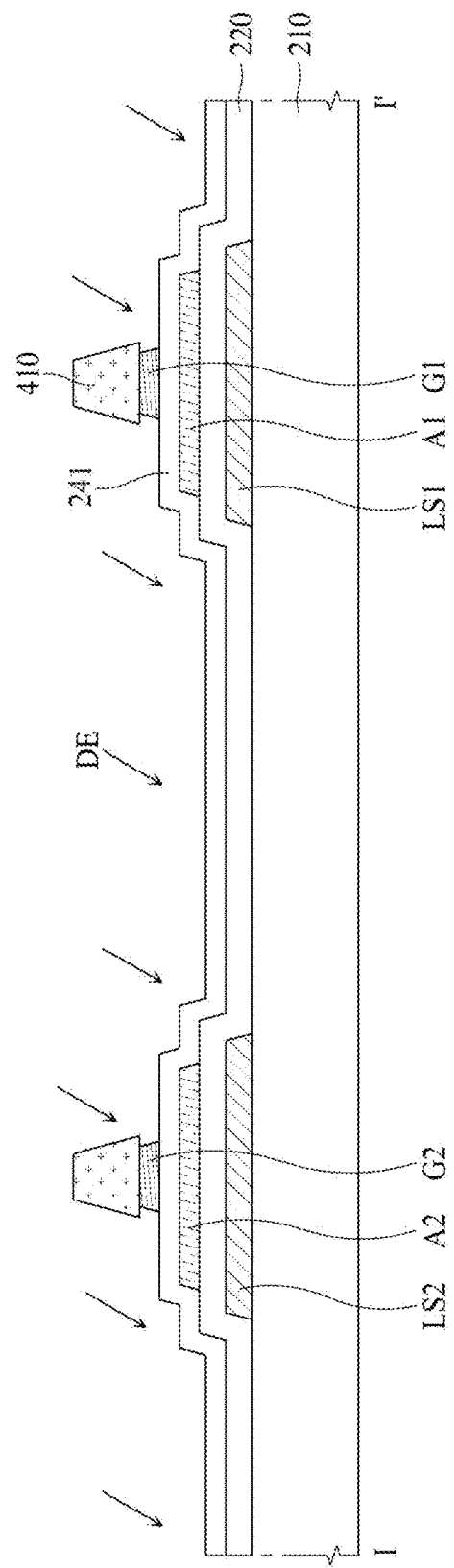

With reference to FIG. 13D, after forming the gate electrode (G1, G2) by the etching process using the photoresist pattern 410 as the mask, a dry etching (DE) process is carried out.

Figure 13E:
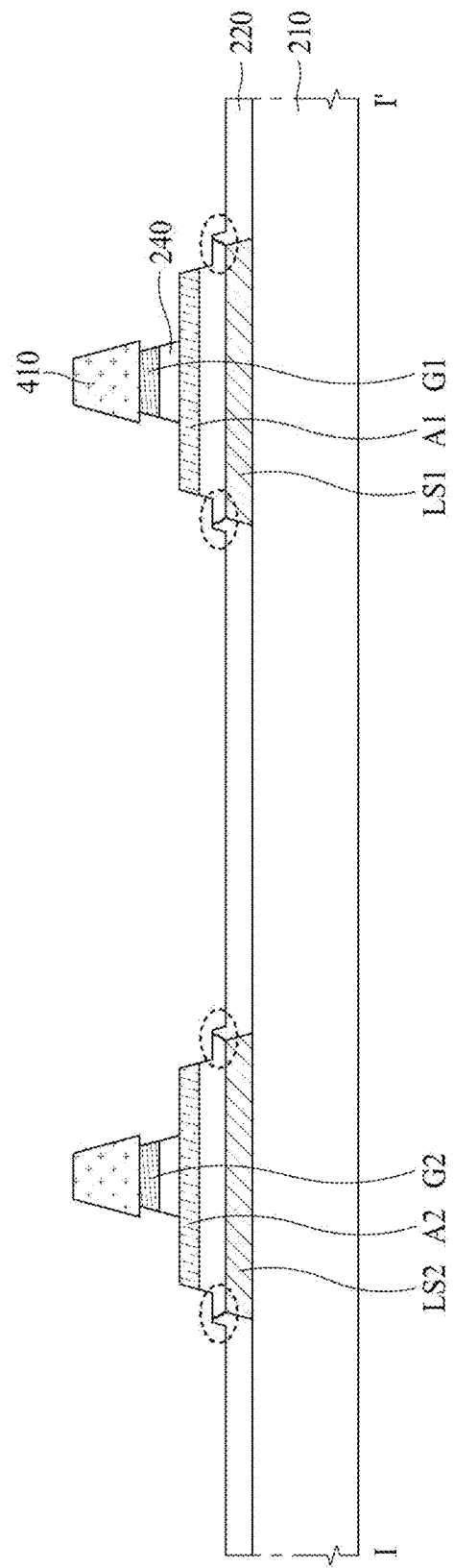

With reference to FIG. 13E, the insulating material layer 241 for the gate insulating film is selectively removed by the dry etching (DE) process, to thereby form the gate insulating film 240.

With reference to FIG. 13E, for the dry etching (DE) process to form the gate insulating film 240, the buffer layer 220 may be partially lost. A step difference may be generated in the buffer layer 220 above the periphery of the conductive layer (LS1, LS2). This step difference corresponds to a protruding portion, which is considerably more removed by the dry etching (DE) process. As a result, the buffer loss of the buffer layer 220 is generated.

In detail, with reference to FIG. 13E, unlike an embodiment of the present disclosure, the stepped portion 222 of the buffer layer 220 is not protected by the first oxide semiconductor layer (A11, A21), whereby the buffer loss of the buffer layer 220 is generated in the stepped portion 222 of the buffer layer 220, to thereby generate a seam in the buffer layer 220.

Figure 13F:
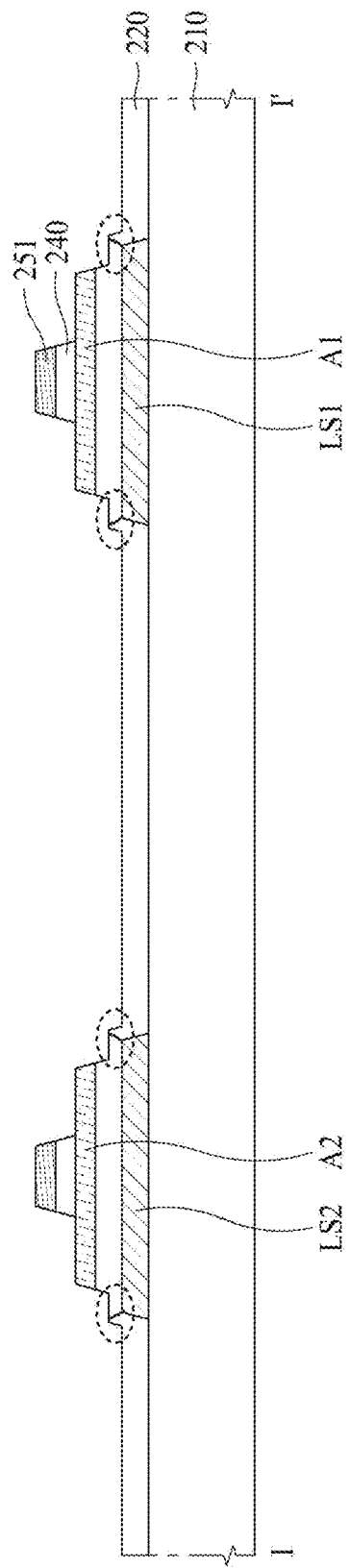

With reference to FIG. 13F, the photoresist pattern 410 is removed by an ashing process. For the ashing process, the buffer layer 220 may be partially lost.

Accordingly, if the stepped portion 222 of the buffer layer 220 is not protected by the first oxide semiconductor layer (A11, A21), the buffer loss of the buffer layer 220 may be generated in the stepped portion 222 of the buffer layer 220, and the seam may be generated in the buffer layer 220. Thus, if a source electrode (S1, S2) and a drain electrode (D1, D2) are formed on the buffer layer 220, a short may be generated between the conductive layer (LS1, LS2) and the source electrode (S1, S2), and/or between the conductive layer (LS1, LS2) and the drain electrode (D1, D2).

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
   a substrate;
   a pixel driver on the substrate; and
   a display element connected to the pixel driver,
   wherein the pixel driver includes:
      a conductive layer on the substrate;
      a buffer layer on the conductive layer;
      a semiconductor layer on the buffer layer;
      a gate electrode, at least a part of the gate electrode overlapping at least a part of the semiconductor layer; and
      a source electrode and a drain electrode respectively connected to the semiconductor layer,
   wherein the buffer layer includes a flattened portion overlapping the conductive layer, and a stepped portion overlapping the periphery of the conductive layer,
   wherein the semiconductor layer includes a first oxide semiconductor layer on the buffer layer, and a second oxide semiconductor layer on the first oxide semiconductor layer,
   wherein a width of the first oxide semiconductor layer is larger than a width of the second oxide semiconductor layer, and
   wherein at least a portion of the first oxide semiconductor layer is on the stepped portion of the buffer layer.

2. The display device according to claim 1, wherein the second oxide semiconductor layer is on the flattened portion of the buffer layer.

3. The display device according to claim 1, wherein the first oxide semiconductor layer extends from the flattened portion of the buffer layer to the stepped portion of the buffer layer.

4. The display device according to claim 1, wherein the first oxide semiconductor layer includes gallium (Ga), and a concentration of gallium (Ga) in the first oxide semiconductor layer is higher than a concentration of gallium (Ga) in the second oxide semiconductor layer.

5. The display device according to claim 4, wherein the first oxide semiconductor layer includes gallium (Ga) of 50 atom % or more than 50 atom % based on total metallic element of the first oxide semiconductor layer with respect to number of atoms.

6. The display device according to claim 1, wherein an etching rate of the first oxide semiconductor layer is lower than an etching rate of the second oxide semiconductor layer under the same etching conditions.

7. The display device according to claim 1, wherein a width of the first oxide semiconductor layer is relatively larger by 0.2 μm~5 μm in comparison to a width of the second oxide semiconductor layer.

8. The display device according to claim 1, wherein a width of the first oxide semiconductor layer is larger than a width of the conductive layer.

9. The display device according to claim 1, wherein the first oxide semiconductor layer has a thickness of 5 nm~25 nm.

10. The display device according to claim 1, wherein the conductive layer is a light blocking layer.

11. The display device according to claim 1, wherein the conductive layer is a wiring configured to supply a signal to the pixel driver.

12. The display device according to claim 1, wherein the semiconductor layer, the gate electrode, the source electrode, and the drain electrode constitute a driving thin film transistor configured to control a driving voltage applied to the display element.

13. A method for manufacturing a display device, comprising:
   forming a conductive layer on a substrate;
   forming a buffer layer on the conductive layer;
   forming a first oxide semiconductor material layer and a second oxide semiconductor material layer on the buffer layer;
   forming a semiconductor layer by patterning the first oxide semiconductor material layer and the second oxide semiconductor material layer; and
   forming a gate insulating film and a gate electrode on the semiconductor layer,
   wherein a width of the first oxide semiconductor layer is larger than a width of the second oxide semiconductor layer; and
   wherein at least a portion of the first oxide semiconductor layer is disposed on a stepped portion of the buffer layer.

14. The method according to claim 13, wherein the first oxide semiconductor material layer and the second oxide semiconductor material layer are formed by metal-organic chemical vapor deposition (MOCVD).

15. The method according to claim 13, wherein a concentration of gallium in the first oxide semiconductor material layer is higher than a concentration of gallium in the second oxide semiconductor material layer.

16. The method according to claim 13, wherein the first oxide semiconductor material layer includes gallium (Ga) of 50 atom % or more than 50 atom % based on total metallic element of the first oxide semiconductor material layer with respect to number of atoms.

17. The method according to claim 13, wherein the first oxide semiconductor material layer has a thickness of 5 nm~25 nm.

* * * * *